United States Patent
Morita

(10) Patent No.: US 11,409,027 B2
(45) Date of Patent: Aug. 9, 2022

(54) EXTREME ULTRAVIOLET LIGHT CONDENSATION MIRROR, EXTREME ULTRAVIOLET LIGHT GENERATION APPARATUS, AND ELECTRONIC DEVICE MANUFACTURING METHOD

(71) Applicant: Gigaphoton Inc., Tochigi (JP)

(72) Inventor: Masayuki Morita, Oyama (JP)

(73) Assignee: Gigaphoton Inc., Tochigi (JP)

( * ) Notice: Subject to any disclaimer, the term of this patent is extended or adjusted under 35 U.S.C. 154(b) by 54 days.

(21) Appl. No.: 17/004,473

(22) Filed: Aug. 27, 2020

(65) Prior Publication Data

US 2021/0109262 A1 Apr. 15, 2021

(30) Foreign Application Priority Data

Oct. 10, 2019 (JP) .............................. JP2019-187100

(51) Int. Cl.
*G02B 5/08* (2006.01)
*G03F 7/20* (2006.01)
*H05G 2/00* (2006.01)

(52) U.S. Cl.
CPC .......... *G02B 5/0891* (2013.01); *G03F 7/7015* (2013.01); *G03F 7/70033* (2013.01); *H05G 2/008* (2013.01)

(58) Field of Classification Search
CPC . G02B 5/0891; G03F 7/70033; G03F 7/7015; G03F 7/70158; G03F 7/70175;
(Continued)

(56) References Cited

U.S. PATENT DOCUMENTS 7,436,490 B2 * 10/2008 Miyake ............... G03F 7/70033
355/71
8,451,429 B2 * 5/2013 Van Empel ......... G03F 7/70958
355/71
(Continued)

FOREIGN PATENT DOCUMENTS

| JP | 6232210 B2 | 11/2017 |
|---|---|---|
| WO | 2014/170093 A2 | 10/2014 |
| WO | 2017/032569 A1 | 3/2017 |

OTHER PUBLICATIONS

Search report and Written opinion issued by the Netherlands Patent Office dated Oct. 29, 2021, which corresponds to Dutch Patent Application No. 2026305 and is related to U.S. Appl. No. 17/004,473.

*Primary Examiner* — Deoram Persaud
(74) *Attorney, Agent, or Firm* — Studebaker & Brackett PC

(57) ABSTRACT

An extreme ultraviolet light condensation mirror may include a reflective surface formed in a concave shape and configured to diffract a laser beam incident from a first focal point and having a wavelength longer than a wavelength of extreme ultraviolet light. The reflective surface may be provided with a plurality of first reflection portions, a plurality of second reflection portions, a plurality of first stepped portions, and a plurality of second stepped portions. The first and second stepped portions may have such heights that the laser beam obtains phases opposite to each other through reflection at the first and second reflection portions adjacent to each other. The height of each first stepped portion may be equal to or higher than the height of each second stepped portion. The height of at least one of the first stepped portions may be higher than the height of each second stepped portion.

26 Claims, 16 Drawing Sheets

(58) Field of Classification Search
CPC ............... G03F 7/70575; H05G 2/008; B01L 2200/0657; B01L 2400/0475; B01L 2400/08; B01L 3/02; B01L 3/0217; G21K 1/062
See application file for complete search history.

(56) References Cited

U.S. PATENT DOCUMENTS

| | | | |
|---|---|---|---|
| 9,612,370 B1* | 4/2017 | Johnson | G02B 5/122 |
| 10,241,421 B2* | 3/2019 | Roos | G03F 7/70841 |
| 2009/0289205 A1* | 11/2009 | Moriya | G02B 5/1838 |
| | | | 250/504 R |
| 2014/0085619 A1* | 3/2014 | Banine | G03F 7/702 |
| | | | 355/71 |
| 2017/0254995 A1* | 9/2017 | Bauer | G02B 19/0023 |
| 2017/0365371 A1* | 12/2017 | Huang | G21K 1/065 |
| 2018/0246414 A1* | 8/2018 | Banine | G02B 27/4244 |

* cited by examiner

EXTREME ULTRAVIOLET LIGHT CONDENSATION MIRROR, EXTREME ULTRAVIOLET LIGHT GENERATION APPARATUS, AND ELECTRONIC DEVICE MANUFACTURING METHOD

CROSS-REFERENCE TO RELATED APPLICATIONS

The present application claims the benefit of Japanese Patent Application No. 2019-187100, filed on Oct. 10, 2019, the entire contents of which are hereby incorporated by reference.

BACKGROUND

1. Technical Field

The present disclosure relates to an extreme ultraviolet light condensation mirror, an extreme ultraviolet light generation apparatus, and an electronic device manufacturing method.

2. Related Art

Recently, miniaturization of a transfer pattern in optical lithography of a semiconductor process has been rapidly proceeding along with miniaturization of the semiconductor process. Minute fabrication at 20 nm or smaller will be requested in the next generation technology. To meet the request for minute fabrication at 20 nm or smaller, it is desired to develop an exposure apparatus including a device configured to generate extreme ultraviolet (EUV) light at a wavelength of 13 nm approximately in combination with reduced projection reflective optics.

Disclosed EUV light generation devices include three kinds of devices of a laser produced plasma (LPP) device that uses plasma generated by irradiating a target material with a pulse laser beam, a discharge produced plasma (DPP) device that uses plasma generated by electrical discharge, and a synchrotron radiation (SR) device that uses synchrotron radiation.

LIST OF DOCUMENTS

Patent Document

Patent Document 1: Japanese Patent No. 6232210

SUMMARY

An extreme ultraviolet light condensation mirror according to an aspect of the present disclosure may include a reflective surface formed in a concave shape and configured to reflect extreme ultraviolet light incident from a first focal point so that the extreme ultraviolet light condenses to a second focal point at a position different from that of the first focal point and diffract a laser beam incident from the first focal point and having a wavelength longer than a wavelength of the extreme ultraviolet light. The reflective surface may be provided with a plurality of first reflection portions, a plurality of second reflection portions, a plurality of first stepped portions, and a plurality of second stepped portions: in a front view of the reflective surface, the first reflection portions surrounding the center of the reflective surface; the second reflection portions surrounding the center and being positioned between the first reflection portions and lower than the adjacent first reflection portions in a direction opposite to a reflection direction; the first stepped portions each being positioned between the corresponding first reflection portion and the second reflection portion adjacent to the first reflection portion on a side of the center; the second stepped portions each being positioned between the corresponding first reflection portion and the second reflection portion adjacent to the first reflection portion on an outer periphery side of the reflective surface. The first and second stepped portions may have such heights that the laser beam obtains phases opposite to each other through reflection at the first and second reflection portions adjacent to each other. The height of each first stepped portion may be equal to or higher than the height of each second stepped portion. The height of at least one of the first stepped portions may be higher than the height of each second stepped portion.

An extreme ultraviolet light condensation mirror according to another aspect of the present disclosure may include a reflective surface formed in a concave shape and configured to reflect extreme ultraviolet light incident from a first focal point so that the extreme ultraviolet light condenses to a second focal point at a position different from that of the first focal point and diffract a laser beam incident from the first focal point and having a wavelength longer than a wavelength of the extreme ultraviolet light. The reflective surface may be provided with a plurality of reflection portions and a plurality of stepped portions: in a front view of the reflective surface, the reflection portions surrounding the center of the reflective surface; the stepped portions each being positioned between the reflection portions adjacent to each other so that one reflection portion of the adjacent reflective portions on a side of the center is lower than the other reflection portion on an outer periphery side of the reflective surface in a direction opposite to a reflection direction. The stepped portions may have such heights that the laser beam obtains phases opposite to each other through reflection at the reflection portions adjacent to each other. The height of at least one of the stepped portions may be higher than such a lowest height that the laser beam obtains phases opposite to each other through reflection at the reflection portions adjacent to each other.

An extreme ultraviolet light generation apparatus according to another aspect of the present disclosure may include: a chamber having an internal space in which a laser beam is condensed and plasma is generated from a target substance at a condensed position of the laser beam; and an extreme ultraviolet light condensation mirror configured to condense extreme ultraviolet light radiated through the plasma generation from the target substance. The extreme ultraviolet light condensation mirror may include a reflective surface formed in a concave shape and configured to reflect extreme ultraviolet light incident from a first focal point as the condensed position so that the extreme ultraviolet light condenses to a second focal point at a position different from that of the first focal point and diffract a laser beam incident from the first focal point and having a wavelength longer than a wavelength of the extreme ultraviolet light. The reflective surface may be provided with a plurality of first reflection portions, a plurality of second reflection portions, a plurality of first stepped portions, and a plurality of second stepped portions: in a front view of the reflective surface, the first reflection portions surrounding the center of the reflective surface; the second reflection portions surrounding the center and being positioned between the first reflection portions and lower than the adjacent first reflection portions in a direction opposite to a reflection direction; the first stepped portions each being positioned between the corresponding first reflection portion and the second reflection portion adjacent to the first reflection portion on a side of the center; the second stepped portions each being positioned between the corresponding first reflection portion and the second reflection portion adjacent to the first reflection portion on an outer periphery side of the reflective surface. The first and second stepped portions may have such heights that the laser beam obtains phases opposite to each other through reflection at the first and second reflection portions adjacent to each other. The height of each first stepped portion may be equal to or higher than the height of each second stepped portion. The height of at least one of the first stepped portions may be higher than the height of each second stepped portion.

An extreme ultraviolet light generation apparatus according to another aspect of the present disclosure may include: a chamber having an internal space in which a laser beam is condensed and plasma is generated from a target substance at a condensed position of the laser beam; and an extreme ultraviolet light condensation mirror configured to condense extreme ultraviolet light radiated through the plasma generation from the target substance. The extreme ultraviolet light condensation mirror may include a reflective surface formed in a concave shape and configured to reflect extreme ultraviolet light incident from a first focal point as the condensed position so that the extreme ultraviolet light condenses to a second focal point at a position different from that of the first focal point and diffract a laser beam incident from the first focal point and having a wavelength longer than a wavelength of the extreme ultraviolet light. The reflective surface may be provided with a plurality of reflection portions and a plurality of stepped portions: in a front view of the reflective surface, the reflection portions surrounding the center of the reflective surface; the stepped portions each being positioned between the reflection portions adjacent to each other so that one reflection portion of the adjacent reflective portions on a side of the center is lower than the other reflection portion on an outer periphery side of the reflective surface in a direction opposite to a reflection direction. The stepped portions may have such heights that the laser beam obtains phases opposite to each other through reflection at the reflection portions adjacent to each other. The height of at least one of the stepped portions may be higher than such a lowest height that the laser beam obtains phases opposite to each other through reflection at the reflection portions adjacent to each other.

An electronic device manufacturing method according to another aspect of the present disclosure may include: generating extreme ultraviolet light with an extreme ultraviolet light generation apparatus; outputting the extreme ultraviolet light to an exposure apparatus; and exposing a photosensitive substrate to the extreme ultraviolet light in the exposure apparatus to manufacture an electronic device. The extreme ultraviolet light generation apparatus may include: a chamber having an internal space in which a laser beam is condensed and plasma is generated from a target substance at a condensed position of the laser beam; and an extreme ultraviolet light condensation mirror configured to condense extreme ultraviolet light radiated through the plasma generation from the target substance. The extreme ultraviolet light condensation mirror may include a reflective surface formed in a concave shape and configured to reflect extreme ultraviolet light incident from a first focal point as the condensed position so that the extreme ultraviolet light condenses to a second focal point at a position different from that of the first focal point and diffract a laser beam incident from the first focal point and having a wavelength longer than a wavelength of the extreme ultraviolet light. The reflective surface may be provided with a plurality of first reflection portions, a plurality of second reflection portions, a plurality of first stepped portions, and a plurality of second stepped portions: in a front view of the reflective surface, the first reflection portions surrounding the center of the reflective surface; the second reflection portions surrounding the center and being positioned between the first reflection portions and lower than the adjacent first reflection portions in a direction opposite to a reflection direction; the first stepped portions each being positioned between the corresponding first reflection portion and the second reflection portion adjacent to the first reflection portion on a side of the center; the second stepped portions each being positioned between the corresponding first reflection portion and the second reflection portion adjacent to the first reflection portion on an outer periphery side of the reflective surface. The first and second stepped portions may have such heights that the laser beam obtains phases opposite to each other through reflection at the first and second reflection portions adjacent to each other. The height of each first stepped portion may be equal to or higher than the height of each second stepped portion. The height of at least one of the first stepped portions may be higher than the height of each second stepped portion.

An electronic device manufacturing method according to another aspect of the present disclosure may include: generating extreme ultraviolet light with an extreme ultraviolet light generation apparatus; outputting the extreme ultraviolet light to an exposure apparatus; and exposing a photosensitive substrate to the extreme ultraviolet light in the exposure apparatus to manufacture an electronic device. The extreme ultraviolet light generation apparatus may include: a chamber having an internal space in which a laser beam is condensed and plasma is generated from a target substance at a condensed position of the laser beam; and an extreme ultraviolet light condensation mirror configured to condense extreme ultraviolet light radiated through the plasma generation from the target substance. The extreme ultraviolet light condensation mirror may include a reflective surface formed in a concave shape and configured to reflect extreme ultraviolet light incident from a first focal point as the condensed position so that the extreme ultraviolet light condenses to a second focal point at a position different from that of the first focal point and diffract a laser beam incident from the first focal point and having a wavelength longer than a wavelength of the extreme ultraviolet light. The reflective surface may be provided with a plurality of reflection portions and a plurality of stepped portions: in a front view of the reflective surface, the reflection portions surrounding the center of the reflective surface; the stepped portions each being positioned between the reflection portions adjacent to each other so that one reflection portion of the adjacent reflective portions on a side of the center is lower than the other reflection portion on an outer periphery side of the reflective surface in a direction opposite to a reflection direction. The stepped portions may have such heights that the laser beam obtains phases opposite to each other through reflection at the reflection portions adjacent to each other. The height of at least one of the stepped portions may be higher than such a lowest height that the laser beam obtains phases opposite to each other through reflection at the reflection portions adjacent to each other.

BRIEF DESCRIPTION OF THE DRAWINGS

Embodiments of the present disclosure will be described below as examples with reference to the accompanying drawings.

DESCRIPTION OF EMBODIMENTS

1. Overview
2. Description of electronic device manufacturing apparatus
3. Description of extreme ultraviolet light generation apparatus
   3.1 Configuration
   3.2 Operation
4. Description of EUV light condensation mirror of comparative example
   4.1 Configuration
   4.2 Problem
5. Description of EUV light condensation mirror of Embodiment 1
   5.1 Configuration
   5.2 Effect
6. Description of EUV light condensation mirror of Embodiment 2
   6.1 Configuration
   6.2 Effect
7. Description of EUV light condensation mirror of Embodiment 3
   7.1 Configuration
   7.2 Effect
8. Description of EUV light condensation mirror of Embodiment 4
   8.1 Configuration
   8.2 Effect Embodiments of the present disclosure will be described below in detail with reference to the accompanying drawings.

The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Overview

Embodiments of the present disclosure relate to an extreme ultraviolet light generation apparatus and an electronic device manufacturing apparatus configured to generate light having a wavelength corresponding to that of what is called extreme ultraviolet. In the present specification, extreme ultraviolet light is referred to as EUV light in some cases.

2. Description of Electronic Device Manufacturing Apparatus

Figure 1:
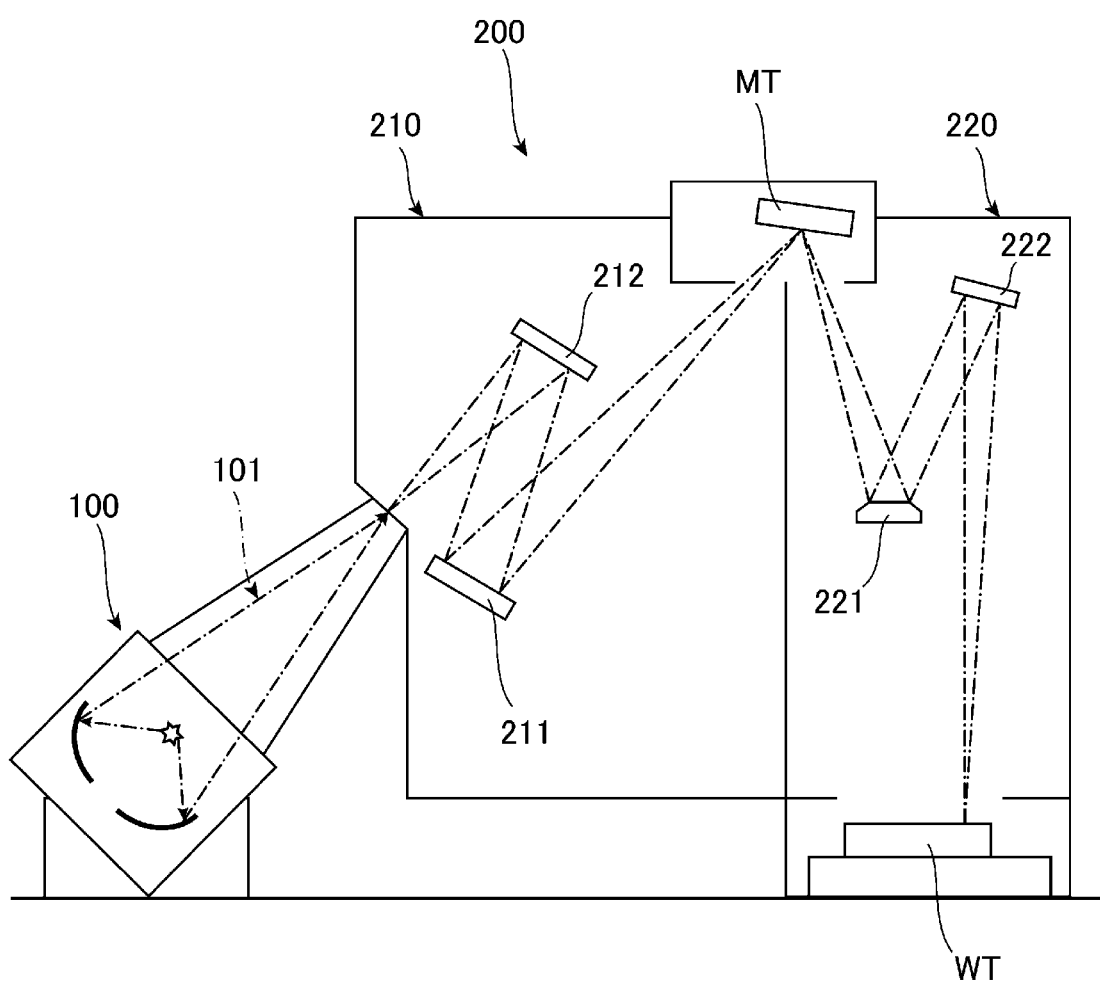
FIG. 1 is a pattern diagram illustrating an exemplary entire schematic configuration of an electronic device manufacturing apparatus.

As illustrated in FIG. 1, the electronic device manufacturing apparatus includes an EUV light generation apparatus 100 and an exposure apparatus 200. The exposure apparatus 200 includes a mask irradiation unit 210 including a plurality of mirrors 211 and 212, and a workpiece irradiation unit 220 including a plurality of mirrors 221 and 222. The mask irradiation unit 210 illuminates a mask pattern on a mask table MT through reflective optics with EUV light 101 incident from the EUV light generation apparatus 100. The workpiece irradiation unit 220 images, through reflective optics, the EUV light 101 reflected by the mask table MT on a workpiece (not illustrated) disposed on a workpiece table WT. The workpiece is a photosensitive substrate such as a semiconductor wafer on which photoresist is applied. The exposure apparatus 200 translates the mask table MT and the workpiece table WT in synchronization to expose the workpiece to the EUV light 101 with the mask pattern reflected. Through an exposure process as described above, a device pattern is transferred onto the semiconductor wafer, thereby manufacturing a semiconductor device.

Figure 2:
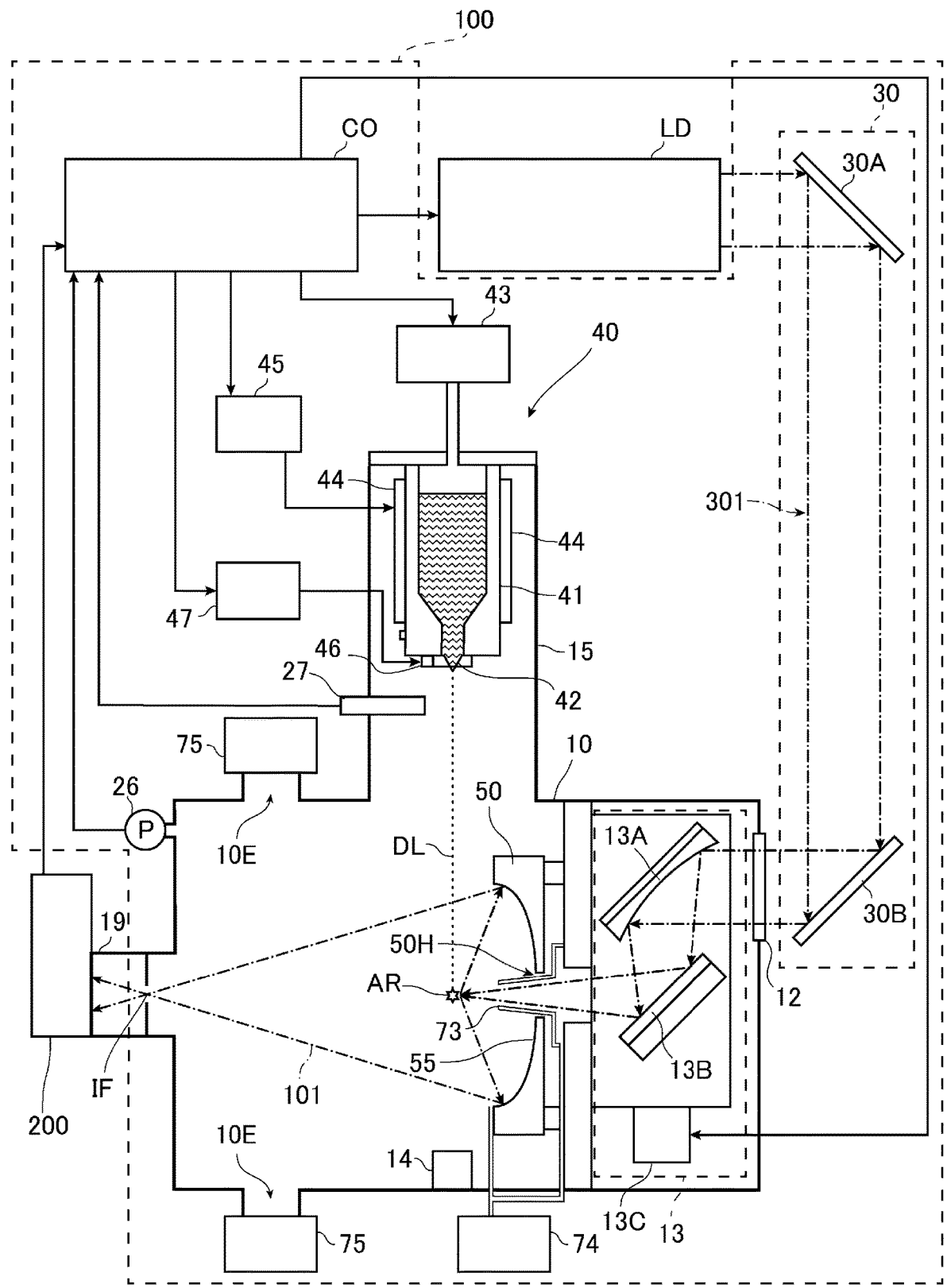
FIG. 2 is a pattern diagram illustrating an exemplary entire schematic configuration of an extreme ultraviolet light generation apparatus.

3. Description of Extreme Ultraviolet Light Generation Apparatus 3.1 Configuration The following describes the extreme ultraviolet light generation apparatus. FIG. 2 is a pattern diagram illustrating an exemplary entire schematic configuration of the extreme ultraviolet light generation apparatus of the present example. As illustrated in FIG. 2, the EUV light generation apparatus 100 according to the present embodiment is connected with a laser apparatus LD. The EUV light generation apparatus 100 according to the present embodiment includes a chamber device 10, a control unit CO, and a laser beam delivery optical system 30 as main components.

The chamber device 10 is a sealable container. The chamber device 10 includes a sub chamber 15 provided with a target supply unit 40. The target supply unit 40 includes a tank 41 and a nozzle 42. The target supply unit 40 supplies a droplet DL to the internal space of the chamber device 10 and is attached to, for example, penetrate through the wall of the sub chamber 15. The droplet DL, which is also called a target, is supplied from the target supply unit 40.

The tank 41 stores inside a target substance that becomes the droplet DL. The target substance contains tin. The inside of the tank 41 is communicated with, through a pipe, a pressure adjuster 43 configured to adjust gas pressure. In addition, a heater 44 is attached to the tank 41. The heater 44 heats the tank 41 by current supplied from a heater power source 45. Through the heating, the target substance in the tank 41 melts. The pressure adjuster 43 and the heater power source 45 are electrically connected with the control unit CO.

The nozzle 42 is attached to the tank 41 and discharges the target substance. A piezoelectric element 46 is attached to the nozzle 42. The piezoelectric element 46 is electrically connected with a piezoelectric power source 47 and driven by voltage applied from the piezoelectric power source 47. The piezoelectric power source 47 is electrically connected with the control unit CO. The target substance discharged from the nozzle 42 is formed into the droplet DL through operation of the piezoelectric element 46.

Further, the chamber device 10 includes a target collection unit 14. The target collection unit 14 collects any unnecessary droplet DL.

The wall of the chamber device 10 is provided with at least one through-hole. The through-hole is blocked by a window 12 through which a laser beam 301 emitted in pulses from the laser apparatus LD transmits.

Furthermore, a laser condensation optical system 13 is disposed in the chamber device 10. The laser condensation optical system 13 includes a laser beam condensation mirror 13A and a high reflectance mirror 13B. The laser beam condensation mirror 13A reflects and condenses the laser beam 301 transmitting through the window 12. The high reflectance mirror 13B reflects the light condensed by the laser beam condensation mirror 13A. The positions of the laser beam condensation mirror 13A and the high reflectance mirror 13B are adjusted by a laser beam manipulator 13C so that a laser focusing position in the chamber device 10 coincides with a position specified by the control unit CO.

An EUV light condensation mirror 50 having a reflective surface 55 in a substantially spheroidal shape is disposed inside the chamber device 10. The EUV light condensation mirror 50 reflects EUV light and has a first focal point and a second focal point for the EUV light. The EUV light condensation mirror 50 is disposed so that, for example, the first focal point is positioned in a plasma generation region AR and the second focal point is positioned at an intermediate focus point IF. A through-hole 50H is provided at a central portion of the EUV light condensation mirror 50, and the laser beam 301 in pulses passes through the through-hole 50H.

The EUV light generation apparatus 100 further includes a connection unit 19 that provides communication between the internal space of the chamber device 10 and the internal space of the exposure apparatus 200. The connection unit 19 includes a wall through which an aperture is formed. The wall is preferably disposed so that the aperture is positioned at the second focal point of the EUV light condensation mirror 50.

The EUV light generation apparatus 100 further includes a pressure sensor 26. The pressure sensor 26 measures the pressure in the internal space of the chamber device 10. The EUV light generation apparatus 100 further includes a target sensor 27 attached to the chamber device 10. The target sensor 27 has, for example, an image capturing function and detects the existence, trajectory, position, speed, and the like of the droplet DL. The pressure sensor 26 and the target sensor 27 are electrically connected with the control unit CO.

The laser apparatus LD includes a master oscillator as a light source configured to perform burst operation. The master oscillator emits the laser beam 301 in pulses in a burst-on duration. The master oscillator is, for example, a $CO_2$ laser apparatus configured to emit a laser beam having a wavelength of 10.6 μm by exciting, through electrical discharging, gas as mixture of carbon dioxide gas with helium, nitrogen, or the like. The master oscillator may emit the laser beam 301 in pulses by a Q switch scheme. The master oscillator may include a light switch, a polarizer, and the like. In the burst operation, the laser beam 301 is emitted in continuous pulses at a predetermined repetition frequency in a burst-on duration and the emission of the laser beam 301 is stopped in a burst-off duration.

The traveling direction of the laser beam 301 emitted from the laser apparatus LD is adjusted by the laser beam delivery optical system 30. The laser beam delivery optical system 30 includes a plurality of mirrors 30A and 30B for adjusting the traveling direction of the laser beam 301, and the position of at least one of the mirrors 30A and 30B is adjusted by an actuator (not illustrated). Through this adjustment of the position of at least one of the mirrors 30A and 30B, the laser beam 301 may propagate into the chamber device 10 through the window 12 appropriately.

The control unit CO may be, for example, a micro controller, an integrated circuit (IC), an integrated circuit such as a large-scale integrated circuit (LSI) or an application specific integrated circuit (ASIC), or a numerical control (NC) device. When the control unit CO is a NC device, the control unit CO may or may not include a machine learning device. The control unit CO controls the entire EUV light generation apparatus 100 and also controls the laser apparatus LD. The control unit CO receives, for example, a signal related to the pressure in the internal space of the chamber device 10, which is measured by the pressure sensor 26, a signal related to image data of the droplet DL captured by the target sensor 27, and a burst signal from the exposure apparatus 200. The control unit CO processes the image data and the like and controls the output timing of the droplet DL, the output direction of the droplet DL, and the like.

The chamber device 10 also includes a gas supply unit 73 configured to supply etching gas to the internal space of the chamber device 10. The gas supply unit 73 is connected with a gas supply tank 74 configured to supply etching gas through a pipe. Since the target substance contains tin as described above, the etching gas is, for example, balance gas having a hydrogen gas concentration of 3% approximately. The balance gas may contain nitrogen ($N_2$) gas or argon (Ar) gas. The pipe between the gas supply unit 73 and the gas supply tank 74 may be provided with a supply gas flow amount adjustment unit (not illustrated).

The gas supply unit 73 has the shape of the side surface of a circular truncated cone and is called a cone in some cases. A gas supply inlet of the gas supply unit 73 is inserted into the through-hole 50H provided to the EUV light condensation mirror 50, and the gas supply unit 73 supplies the etching gas through the through-hole 50H in a direction departing from the EUV light condensation mirror 50. The laser beam 301 passes through the through-hole 50H of the EUV light condensation mirror 50 as described above through the gas supply unit 73. Accordingly, the gas supply unit 73 has a configuration through which the laser beam 301 can transmit on the window 12 side.

Tin fine particles and tin charged particles are generated when plasma is generated from the target substance forming the droplet DL in the plasma generation region AR. The etching gas supplied from the gas supply unit 73 contains hydrogen that reacts with tin contained in these fine particles and charged particles. Through the reaction with hydrogen, tin becomes stannane ($SnH_4$) gas at room temperature.

The chamber device 10 further includes a pair of discharge ports 10E. The discharge ports 10E are provided, for example, at positions facing each other on the wall of the chamber device 10. The residual gas contains tin fine particles and charged particles generated through the plasma generation from the target substance, stannane generated through the reaction of the tin fine particles and charged particles with the etching gas, and unreacted etching gas. Some of the charged particles are neutralized in the chamber device 10, and the residual gas contains the neutralized charged particles as well. Each discharge port 10E through which the residual gas is discharged is connected with a discharge pipe, and the discharge pipe is connected with an exhaust device 75. Thus, the residual gas discharged through the discharge ports 10E flows into the exhaust device 75 through the discharge pipe.

3.2 Operation

In the EUV light generation apparatus 100, an atmosphere in the chamber device 10 is discharged, for example, at new installation or maintenance. In this process, purge and discharge may be repeated in the chamber device 10 to discharge components in the atmosphere. Purge gas is preferably inert gas such as nitrogen ($N_2$) or argon (Ar). When the pressure in the chamber device 10 becomes equal to or smaller than a predetermined pressure after the atmosphere in the chamber device 10 is discharged, the control unit CO starts introduction of the etching gas from the gas supply unit 73 into the chamber device 10. In this case, the control unit CO may control a flow rate adjuster (not illustrated) while discharging gas in the internal space of the chamber device 10 to the exhaust device 75 through the discharge ports 10E so that the pressure in the internal space of the chamber device 10 is maintained at the predetermined pressure. The control unit CO maintains the pressure in the internal space of the chamber device 10 substantially constant based on a signal related to the pressure in the internal space of the chamber device 10, which is measured by the pressure sensor 26. The pressure in the internal space of the chamber device 10 in this case is, for example, 10 Pa to 80 Pa.

The control unit CO supplies current from the heater power source 45 to the heater 44 to increase the temperature of the heater 44 so that the target substance in the tank 41 is heated to or maintained at a predetermined temperature equal to or higher than the melting point. Thereafter, the control unit CO controls the temperature of the target substance to the predetermined temperature by adjusting the amount of current supplied from the heater power source 45 to the heater 44 based on an output from a temperature sensor (not illustrated). The predetermined temperature is in a range of, for example, 250° C. to 290° C. when the target substance is tin.

The control unit CO controls the pressure adjuster 43 to adjust the pressure in the tank 41 so that the target substance being melted is output through a nozzle hole of the nozzle 42 at a predetermined speed. The target substance discharged through the hole of the nozzle 42 may be in the form of jet. In this case, the control unit CO generates the droplet DL by applying voltage having a predetermined waveform to the piezoelectric element 46 through the piezoelectric power source 47. Vibration of the piezoelectric element 46 can propagate through the nozzle 42 to a jet of the target substance output from the hole of the nozzle 42. The jet of the target substance is divided in a predetermined period by the vibration, and accordingly, the droplet DL is generated from the target substance.

The control unit CO outputs a light emission trigger to the laser apparatus LD. Having received the light emission trigger, the laser apparatus LD emits the laser beam 301 having a wavelength of, for example, 10.6 μm in pulses. The emitted laser beam 301 is incident on the laser condensation optical system 13 through the laser beam delivery optical system 30 and the window 12. In this case, the control unit CO controls the laser beam manipulator 13C of the laser condensation optical system 13 so that the laser beam 301 condenses in the plasma generation region AR. In addition, the control unit CO controls the laser apparatus LD to emit the laser beam 301 based on a signal from the target sensor 27 so that the droplet DL is irradiated with the laser beam 301. Accordingly, the droplet DL is irradiated in the plasma generation region AR with the laser beam 301 converged by the laser beam condensation mirror 13A. Plasma generated through the irradiation radiates light including EUV light having a wavelength of, for example, 13.5 nm.

Among the light including EUV light generated in the plasma generation region AR, the EUV light 101 is reflected and condensed to the intermediate focus point IF by the EUV light condensation mirror 50 and then incident on the exposure apparatus 200. Part of the laser beam 301 with which the droplet DL is irradiated is reflected by the droplet DL, and part of the reflected beam is diffracted by the EUV light condensation mirror 50. Details of the diffraction will be described later.

When plasma is generated from the target substance, charged fine particles and electrically neutral fine particles are generated as described above. Some of the fine particles flow into the discharge ports 10E. For example, a magnetic field generation unit (not illustrated) or the like may be provided to generate a magnetic field for converging charged fine particles generated in the plasma generation region AR to the discharge ports 10E. In this case, each charged fine particle receives Lorentz force from the magnetic field and is induced to the discharge ports 10E while converging on a helical trajectory along a magnetic field line, and a large number of charged fine particles flow into the discharge ports 10E. Some other of the fine particles diffusing in the chamber device 10 adhere to a reflective surface 55 of the EUV light condensation mirror 50. Some of the fine particles adhering to the reflective surface 55 become predetermined product material through reaction with the etching gas supplied from the gas supply unit 73. When the target substance is tin and the etching gas contains hydrogen as described above, the product material is stannane gas at room temperature. The product material obtained through reaction with the etching gas flows into the discharge ports 10E on flow of unreacted etching gas. The fine particles and residual gas having flowed into the discharge ports 10E are provided with predetermined discharge treatment such as detoxification at the exhaust device 75.

4. Description of EUV Light Condensation Mirror of Comparative Example

The following describes the EUV light condensation mirror 50 of a comparative example in an extreme ultraviolet light generation apparatus 100 described above. Any component same as that described above is denoted by an identical reference sign, and duplicate description thereof is omitted unless specific description is needed.

4.1 Configuration

First Example

Figure 3:
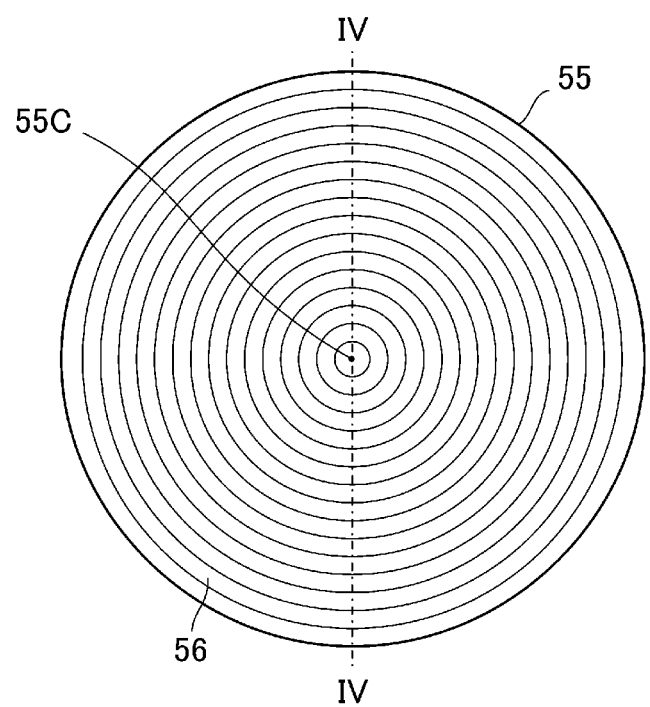
FIG. 3 is a front view of an EUV light condensation mirror from a reflective surface side in a comparative example.
Figure 4:
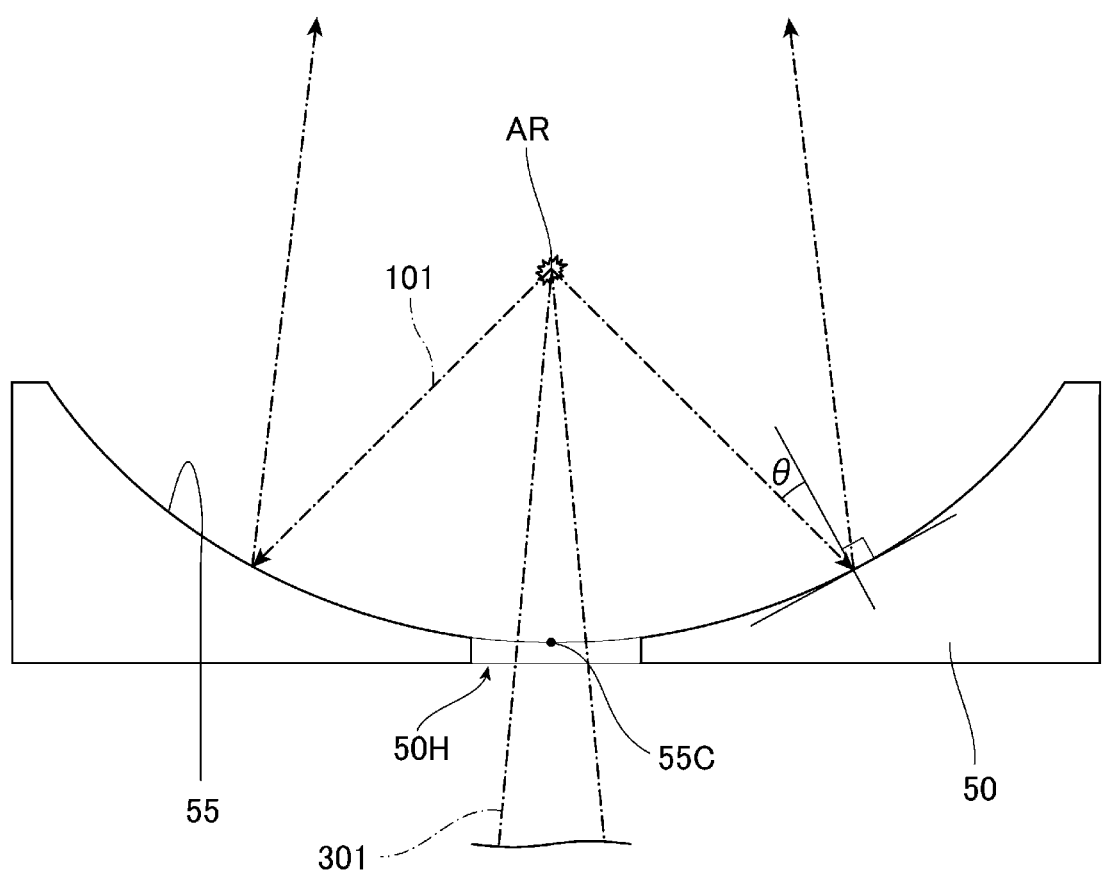
FIG. 4 is a cross-sectional view taken along line IV-IV of FIG. 3 in a first example of the comparative example.
Figure 5:
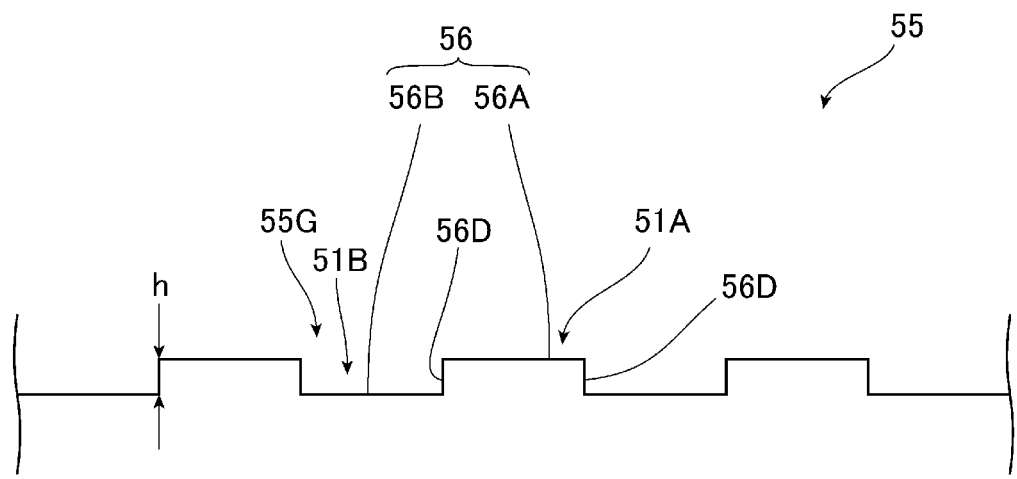
FIG. 5 is an enlarged view illustrating part of a reflective surface in FIG. 4.

In the present example, the reflective surface 55 is a binary diffraction grating. FIG. 3 is a front view of the EUV light condensation mirror 50 from the reflective surface 55 side in the comparative example. In the following drawings, illustration of the through-hole 50H is omitted in some cases. FIG. 4 is a cross-sectional view taken along line IV-IV of FIG. 3 in the present example. FIG. 5 is an enlarged view illustrating part of the reflective surface in FIG. 4. The EUV light condensation mirror 50 is recessed in a substantially spheroid shape on the reflective surface 55 side, and irregularities are formed on the surface. Specifically, the average of the irregularities of the reflective surface of the EUV light condensation mirror 50 is part of an elliptical surface conjugate to the first focal point as the plasma generation region AR and to the second focal point as the intermediate focus point IF. Although not particularly illustrated, the reflective surface 55 includes a multi-layer reflective film for reflecting the EUV light 101.

In the present example, a plurality of convex portions 51A having concentrically circular shapes centered at a center 55C of the reflective surface 55, and a plurality of concave portions 51B each positioned between the convex portions 51A adjacent to each other are provided. The concave portions 51B serve as a plurality of grooves 55G having concentrically circular shapes and provided on the reflective surface 55. As illustrated in FIG. 5, sections of the convex portions 51A and the concave portions 51B of the present example have substantially rectangular shapes.

In the present example, the top surface of each convex portion 51A is a first reflection portion 56A of the reflective surface 55, and the bottom surface of each concave portion 51B is a second reflection portion 56B of the reflective surface 55. Each reflection portion 56 is formed by one first reflection portion 56A and one second reflection portion 56B adjacent to the first reflection portion 56A. In the present example, the reflective surface 55 includes a plurality of first reflection portions 56A and a plurality of second reflection portions 56B, in a front view of the reflective surface 55, the first reflection portions 56A having concentrically circular shapes and surrounding the center 55C, the second reflection portions 56B having concentrically circular shapes and surrounding the center 55C. Each second reflection portion 56B is positioned between the first reflection portions 56A adjacent to each other. In addition, a stepped portion 56D is positioned between each first reflection portion 56A and the corresponding second reflection portion 56B. In the present example, the multi-layer reflective film is provided to at least each of the first and second reflection portions 56A and 56B. The first and second reflection portions 56A and 56B are shaped as parts of a substantially spheroid shape having focal points at the plasma generation region AR and the intermediate focus point IF. In other words, the first and second reflection portions 56A and 56B are parts of an elliptical surface conjugate to the plasma generation region AR and the intermediate focus point IF. Thus, the first and second reflection portions 56A and 56B are each parallel to a surface obtained by averaging the irregularities of the reflective surface 55 of the EUV light condensation mirror 50.

In the present example, reflected light generated when the laser beam 301 having a wavelength of, for example, 10.6 μm and reflected by the droplet DL in the plasma generation region AR is reflected by each first reflection portion 56A interferes with reflected light generated when the laser beam 301 is reflected by each second reflection portion 56B. Thus, with the step between each first reflection portion 56A and the corresponding second reflection portion 56B, the EUV light condensation mirror 50 functions as a diffraction grating for the laser beam 301 reflected by the droplet DL in the plasma generation region AR. However, the EUV light condensation mirror 50 does not function as a diffraction grating but functions as a mirror for the EUV light 101 having a wavelength of, for example, 13.5 nm.

The grooves 55G have a pitch of, for example, 0.5 mm to 2 mm inclusive, preferably 1 mm to 1.4 mm inclusive. The pitch is equal to the pitch of the reflection portions 56.

When λ represents the wavelength of the laser beam 301 emitted from the laser apparatus LD and θ represents the incident angle of light reflected by the droplet DL and incident on the first and second reflection portions 56A and 56B of the reflective surface 55 of the EUV light condensation mirror 50, the depth of each groove 55G, in other words, a height h of each stepped portion 56D is expressed by Expression (1) below. Since this light is incident from the plasma generation region AR, the light may be the laser beam 301 reflected by the droplet DL and incident on the reflective surface 55 or may be the EUV light 101 radiated by the droplet DL.

$$h = (\lambda/4)/\cos\theta \tag{1}$$

The incident angle θ changes with the position at which the laser beam 301 is incident on the reflective surface 55. Since the first and second reflection portions 56A and 56B are each parallel to the surface obtained by averaging the irregularities of the reflective surface 55 of the EUV light condensation mirror 50 as described above, the incident angle θ of the laser beam 301 incident at a predetermined position of the EUV light condensation mirror 50 is equal to the angle between a line connecting the plasma generation region AR and the predetermined position and the normal of the reflective surface 55 of the EUV light condensation mirror 50 at the predetermined position as illustrated in FIG. 4. Thus, the height h of the stepped portion 56D increases toward the outer periphery side of the reflective surface 55.

When the height h of the stepped portion 56D satisfies Expression (1), the laser beam 301 obtains phases opposite to each other through reflection at the first reflection portion 56A and the second reflection portion 56B. The height h that satisfies Expression (1) is such a lowest height that the laser beam 301 obtains phases opposite to each other through reflection at the first reflection portion 56A and the second reflection portion 56B.

The zeroth-order diffracted light of the laser beam 301 incident on the reflective surface 55 from the plasma generation region AR of the EUV light condensation mirror 50 can condense to the intermediate focus point IF as illustrated in FIG. 2. However, when the height h of the stepped portion 56D satisfies Expression (1) described above, the intensity of the zeroth-order diffracted light is weakened due to interference between the laser beam 301 reflected by the first reflection portion 56A and the laser beam 301 reflected by the second reflection portion 56B. Diffracted light other than the zeroth-order diffracted light of the laser beam 301 incident on the reflective surface 55 from the plasma generation region AR of the EUV light condensation mirror 50 does not condense to the intermediate focus point IF but condenses in a ring shape on a wall surface around the intermediate focus point IF. Thus, light other than the zeroth-order diffracted light among the laser beams 301 incident on the EUV light condensation mirror 50 is prevented from being emitted from the chamber device 10.

In addition, since the first and second reflection portions 56A and 56B have spheroid shapes as described above, the EUV light 101 incident from the plasma generation region AR on the EUV light condensation mirror 50 is reflected by the first and second reflection portions 56A and 56B and condenses to the intermediate focus point IF.

Second Example

The following describes the EUV light condensation mirror 50 of a second example in the comparative example. Any component same as that described above is denoted by an identical reference sign, and duplicate description thereof is omitted unless specific description is needed.

Figure 6:
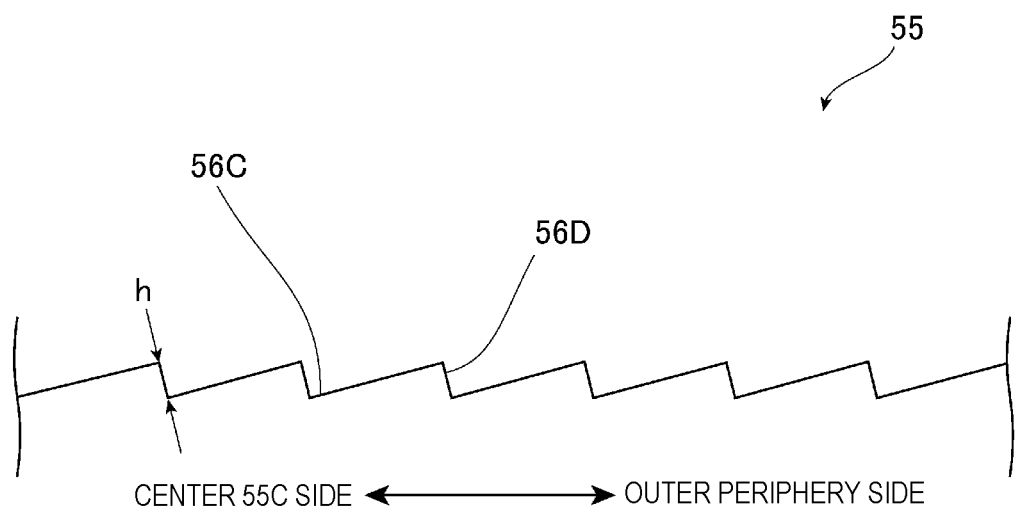
FIG. 6 is an enlarged view illustrating part of the reflective surface in FIG. 4 in a second example of the comparative example.

In the present example, the reflective surface 55 is a blazed diffraction grating. A front view of the EUV light condensation mirror 50 from the reflective surface 55 side in the present example is same as that in FIG. 3, and a cross-sectional view taken along line IV-IV of FIG. 3 in the present example is same as that in FIG. 4. FIG. 6 is an enlarged view illustrating part of the reflective surface in FIG. 4 in the present example. In the present example, the reflective surface 55 is formed in a saw teeth shape in a sectional view and includes pairs of two surfaces having tilt angles different from each other and provided adjacent to each other to surround the center 55C of the reflective surface 55. In other words, the reflective surface 55 includes concentric repetitions of two surfaces having tilt angles different from each other. In FIG. 6, the center 55C side and the outer periphery side are indicated by arrows.

One of the surfaces adjacent to each other is a reflection portion 56C of the reflective surface 55 and has a substantially spheroid shape having focal points at the plasma generation region AR and the intermediate focus point IF. Thus, each reflection portion 56C is part of an elliptical surface conjugate to the plasma generation region AR and the intermediate focus point IF. The reflection portion 56C corresponds to the reflection portion 56 in FIG. 3. The reflection portion 56C is tilted toward the center 55C side. The other of the surfaces adjacent to each other is substantially orthogonal to the reflection portion 56C and is the stepped portion 56D between the reflection portions 56C adjacent to each other. Accordingly, in the present example, the reflective surface 55 includes a plurality of reflection portions 56C having concentrically circular shapes and surrounding the center 55C in a front view of the reflective surface 55, and each stepped portion 56D is positioned between the reflection portions 56C. In the present example, the multi-layer reflective film is provided to at least each reflection portion 56C. Although not particularly illustrated, the reflective surface 55 also includes a multi-layer reflective film for reflecting the EUV light 101. This multi-layer reflective film is provided to at least each reflection portion 56. The reflection portions 56 are shaped as parts of a substantially spheroid shape having focal points at the plasma generation region AR and the intermediate focus point IF. In other words, each reflection portion 56 is part of an elliptical surface conjugate to the plasma generation region AR and the intermediate focus point IF.

When the laser beam 301 having a wavelength of, for example, 10.6 μm and reflected by the droplet DL in the plasma generation region AR is reflected by the reflection portions 56C adjacent to each other, the reflected beams interfere with each other. Thus, with the step between the reflection portions 56C adjacent to each other, the EUV light condensation mirror 50 functions as a diffraction grating for the laser beam 301 having a wavelength of, for example, 10.6 μm and reflected by the droplet DL. However, the EUV light condensation mirror 50 does not function as a diffraction grating but functions as a mirror for the EUV light 101 having a wavelength of, for example, 13.5 nm.

The reflection portions 56C have a pitch of, for example, 0.5 mm to 2 mm inclusive, preferably 1 mm to 1.4 mm inclusive. The height h of the stepped portion 56D is expressed by Expression (2) below.

$$h = (\lambda/2)/\cos\theta \qquad (2)$$

In this case, λ and θ have meanings same as those of λ and θ in the first example.

As in Expression (2), the height h of the stepped portion 56D increases toward the outer periphery side of the reflective surface 55 in the present example as well. In addition, when the height h of the stepped portion 56D satisfies Expression (2), the laser beam 301 obtains phases opposite to each other through reflection at the reflection portions 56C adjacent to each other in the present example as well. The height h that satisfies Expression (2) is such a lowest height that the laser beam 301 obtains phases opposite to each other through reflection at the reflection portions 56C adjacent to each other.

In the present example as well, the zeroth-order diffracted light of the laser beam 301 incident on the reflective surface 55 from the plasma generation region AR of the EUV light condensation mirror 50 can condense to the intermediate focus point IF as illustrated in FIG. 2. However, when the height h of the step satisfies Expression (2) described above, the intensity of the zeroth-order diffracted light is weakened due to interference between the laser beams 301 reflected by the reflection portions 56C adjacent to each other. Diffracted light other than the zeroth-order diffracted light of the laser beam 301 incident on the reflective surface 55 from the plasma generation region AR of the EUV light condensation mirror 50 does not condense to the intermediate focus point IF but condenses in a ring shape on the wall surface around the intermediate focus point IF. Thus, light other than the zeroth-order diffracted light among the laser beams 301 incident on the EUV light condensation mirror 50 is prevented from being emitted from the chamber device 10.

Further, since the reflection portions 56C have spheroid shapes as described above in the present example as well, the EUV light 101 incident from the plasma generation region AR on the EUV light condensation mirror 50 is reflected and condensed to the intermediate focus point IF by the reflection portions 56C as in the first example.

4.2 Problem

Degradation of the EUV light condensation mirror 50 is mainly due to degradation of the multi-layer reflective film, and the reflectance of the EUV light 101 reduces where the multi-layer reflective film has degraded. The degradation of the multi-layer reflective film is mainly due to adhesion of fine particles scattered when the droplet DL is irradiated with the laser beam 301. The degradation of the multi-layer reflective film provokes blistering of the multi-layer reflective film, oxidation degradation, tin implant degradation, and the like, and accordingly, the multi-layer reflective film becomes more likely to degrade. The speed of degradation of the multi-layer reflective film depends on the irradiation intensity of the EUV light 101 with which the multi-layer reflective film is irradiated, and the density of ions attributable to plasma generated on the surface of the multi-layer reflective film when the droplet DL is irradiated with the laser beam 301.

The reflective surface 55 of the EUV light condensation mirror 50 has a substantially spheroid shape as described above. Thus, the center 55C side of the reflective surface 55 of the EUV light condensation mirror 50 is closer to the plasma generation region AR as the first focal point than the outer periphery side thereof. Accordingly, fine particles scattered when the droplet DL is irradiated with the laser beam 301 tend to be more likely to adhere on the center 55C side of the reflective surface 55 of the EUV light condensation mirror 50 than the outer periphery side. In addition, the irradiation intensity of the EUV light 101 with which the multi-layer reflective film is irradiated and the density of ions attributable to plasma on the surface of the multi-layer reflective film tend to be higher on the center 55C side of the reflective surface 55 of the EUV light condensation mirror 50 than the outer periphery side.

Thus, in the EUV light condensation mirror 50 of the comparative example, the multi-layer reflective film tends to be likely to degrade on the center 55C side of the reflective surface 55 of the EUV light condensation mirror 50 than the outer periphery side. When the EUV light condensation mirror 50 partially degrades in this manner, the distribution of irradiation intensity of the EUV light 101 emitted from the EUV light generation apparatus 100 may unintentionally changes. Accordingly, the lifetime of the EUV light condensation mirror 50 of the comparative example tends to be determined by the degradation of the multi-layer reflective film on the center 55C side of the reflective surface 55.

Each embodiment below exemplarily describes an EUV light condensation mirror in which the irradiation intensity of the EUV light 101 incident on the center 55C side of the reflective surface 55 and the density of ions attributable to plasma are reduced.

5. Description of EUV Light Condensation Mirror of Embodiment 1

The following describes the configuration of an EUV light condensation mirror of Embodiment 1. Any component same as that described above is denoted by an identical reference sign, and duplicate description thereof is omitted unless specific description is needed.

5.1 Configuration

Figure 7:
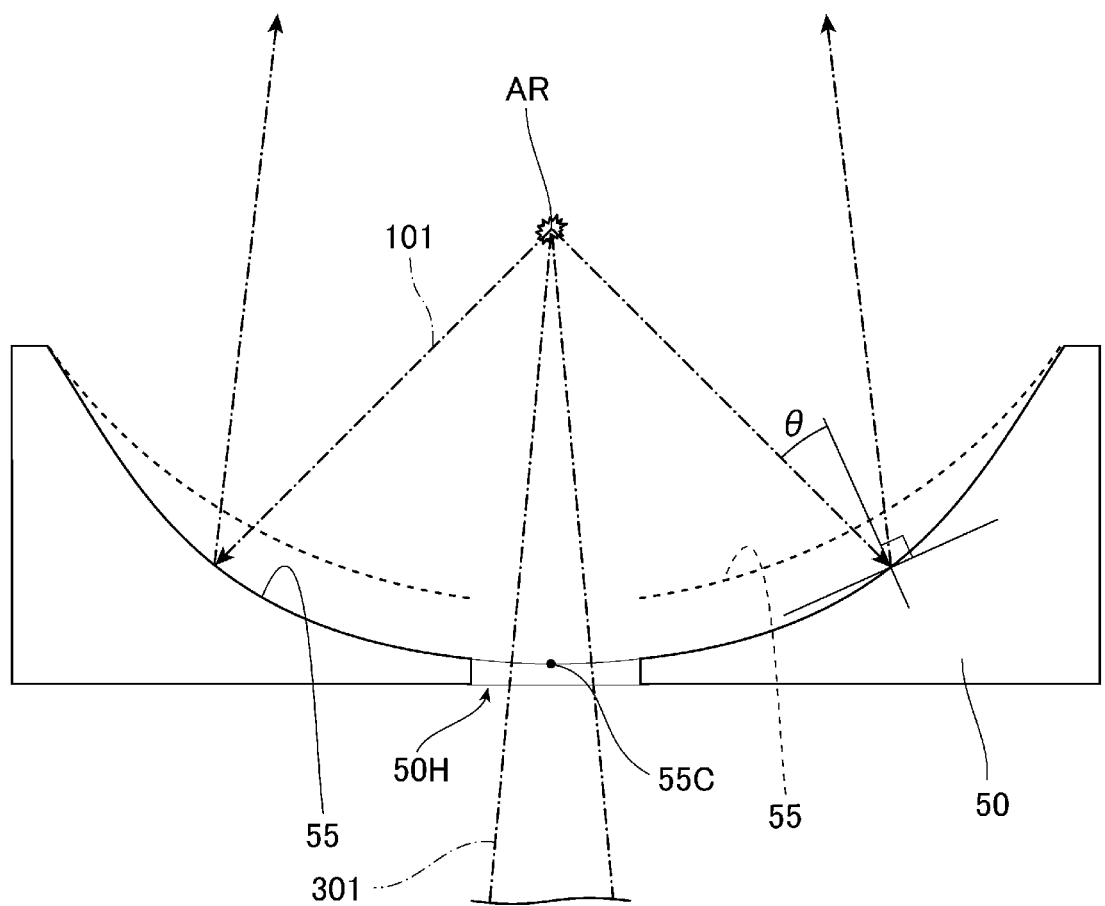
FIG. 7 is a cross-sectional view taken along line IV-IV of FIG. 3 in Embodiment 1.
Figure 8:
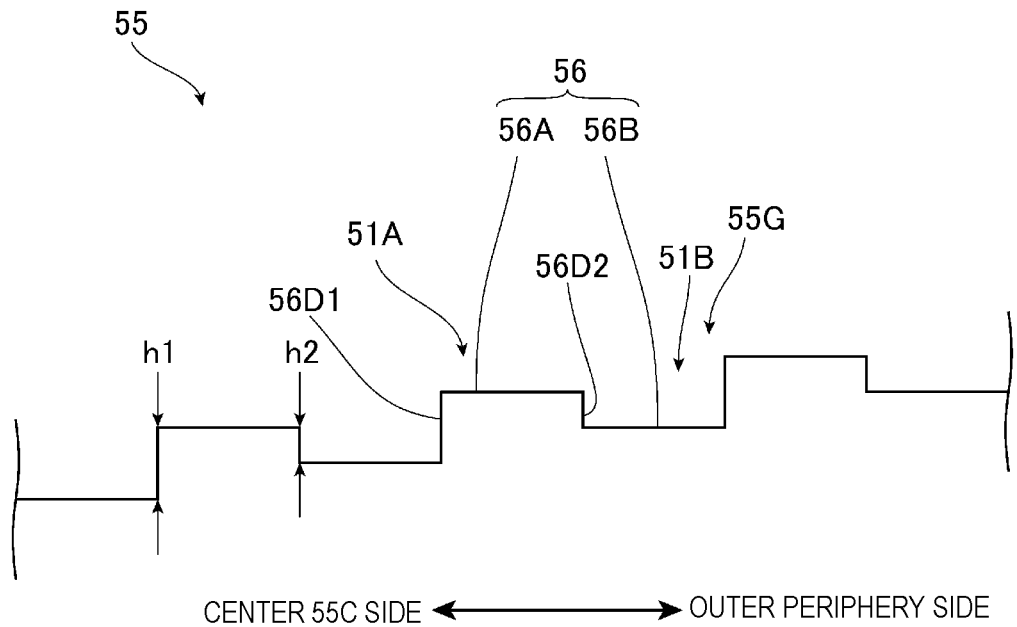
FIG. 8 is an enlarged view illustrating part of the reflective surface in FIG. 7 in Embodiment 1.

The reflective surface 55 of the EUV light condensation mirror 50 of the present embodiment includes a binary diffraction grating. A front view of the EUV light condensation mirror 50 of the present embodiment from the reflective surface 55 side is same as that in FIG. 3. FIG. 7 is a cross-sectional view taken along line IV-IV of FIG. 3 in the present embodiment, and FIG. 8 is an enlarged view illustrating part of the reflective surface in FIG. 7. In the present embodiment, similarly to the first example in the comparative example, the reflective surface 55 is provided with the convex portions 51A having concentrically circular shapes centered at the center 55C, and the concave portions 51B each positioned between the convex portions 51A adjacent to each other. In the present embodiment as well, the top surface of each convex portion 51A is the first reflection portion 56A of the reflective surface 55, and the bottom surface of each concave portion 51B is the second reflection portion 56B of the reflective surface 55. Thus, the second reflection portion 56B is lower than the first reflection portion 56A adjacent to the second reflection portion 56B in a direction opposite to a reflection direction. In addition, in the present embodiment as well, the reflective surface 55 includes the first reflection portions 56A and the second reflection portions 56B, in a front view of the reflective surface 55, the first reflection portions 56A having concentrically circular shapes and surrounding the center 55C, the second reflection portions 56B having concentrically circular shapes and surrounding the center 55C. Each second reflection portion 56B is positioned between the first reflection portions 56A adjacent to each other. The shape of each first reflection portion 56A and the shape of each second reflection portion 56B are same as the shape of the first reflection portion 56A and the shape of the second reflection portion 56B in the comparative example. In addition, although not particularly illustrated, the reflective surface 55 includes the multi-layer reflective film for reflecting the EUV light 101. The multi-layer reflective film is provided to at least each of the first and second reflection portions 56A and 56B. The first and second reflection portions 56A and 56B are each shaped as parts of a substantially spheroid shape having focal points at the plasma generation region AR and the intermediate focus point IF. In other words, the first and second reflection portions 56A and 56B are parts of an elliptical surface conjugate to the plasma generation region AR and the intermediate focus point IF, and this relation holds for a configuration in which the reflective surface 55 includes a binary diffraction grating in the following embodiments as well. In FIG. 8, the center 55C side and the outer periphery side are indicated by arrows.

In the present embodiment, a first stepped portion 56D1 is provided between each first reflection portion 56A and the second reflection portion 56B adjacent to the first reflection portion 56A on the center 55C side of the reflective surface 55. Further, a second stepped portion 56D2 is provided between each first reflection portion 56A and the second reflection portion 56B adjacent to the first reflection portion 56A on the outer periphery side of the reflective surface 55. Thus, an edge of the first reflection portion 56A on the center 55C side is connected with the first stepped portion 56D1, and an edge of the first reflection portion 56A on the outer periphery side of the reflective surface 55 is connected with the second stepped portion 56D2. In addition, an edge of the second reflection portion 56B on the center 55C side is connected with the second stepped portion 56D2, and an edge of the second reflection portion 56B on the outer periphery side of the reflective surface 55 is connected with the first stepped portion 56D1. The height of the first stepped portion 56D1 is higher than the height of the second stepped portion 56D2.

In the present embodiment as well, with the step between each first reflection portion 56A and the corresponding second reflection portion 56B, the EUV light condensation mirror 50 functions as a diffraction grating for the laser beam 301 having a wavelength of, for example, 10.6 µm and reflected by the droplet DL. However, the EUV light condensation mirror 50 does not function as a diffraction grating but functions as a mirror for the EUV light 101 having a wavelength of, for example, 13.5 nm.

The pitch of the reflection portions 56 each including one first reflection portion 56A and one second reflection portion 56B adjacent to each other is, for example, 0.5 mm to 2 mm inclusive, preferably 1 mm to 1.4 mm inclusive.

A height h1 of the first stepped portion 56D1 is expressed by Expression (3) below.

$$0.98 \times (\lambda/4 + n\lambda/2)/\cos \theta \leq h1 \leq 1.02 \times (\lambda/4 + n\lambda/2)/\cos \theta \quad (3)$$

In the present embodiment, $\lambda$ has a meaning same as that of $\lambda$ in the first example of the comparative example, and $\theta$ is same as $\theta$ in the first example of the comparative example. Specifically, in the present embodiment as well, $\theta$ represents the incident angle of light incident on the first and second reflection portions 56A and 56B on the reflective surface 55 of the EUV light condensation mirror 50 from the plasma generation region AR. Thus, as illustrated in FIG. 7, $\theta$ is equal to the angle between a line connecting the plasma generation region AR and a predetermined position and the normal of each of the first and second reflection portions 56A and 56B at the predetermined position. However, as described later, the shape of the surface obtained by averaging the irregularities of the reflective surface 55 of the EUV light condensation mirror 50 of the present embodiment is different from the shape of the surface of the comparative example. Accordingly, as illustrated in FIG. 7, the angle between the line connecting the plasma generation region AR and the predetermined position and the normal of the surface obtained by averaging the irregularities of the reflective surface 55 of the EUV light condensation mirror 50 at the predetermined position is different from the incident angle $\theta$ of light incident on the first and second reflection portions 56A and 56B unlike the first example of the comparative example. In the expression, n is an integer equal to or larger than one and is a coefficient that provides the groove depth.

The height h1 more preferably satisfies Expression (4) below.

$$h1 = (\lambda/4 + n\lambda/2)/\cos \theta \quad (4)$$

Specifically, h1 specified by Expression (3) allows an error of ±2% relative to h1 specified by Expression (4).

Within such an error, h1 can be regarded as such a height that the laser beam 301 obtains phases opposite to each other through reflection at the first and second reflection portions 56A and 56B adjacent to each other through the first stepped portion 56D1.

A height h2 of the second stepped portion 56D2 is expressed by Expression (5) below.

$$0.98 \times (\lambda/4)/\cos \theta \leq h2 \leq 1.02 \times (\lambda/4)/\cos \theta \quad (5)$$

In addition, the height h2 more preferably satisfies Expression (6) below.

$$h2 = (\lambda/4)/\cos \theta \quad (6)$$

Specifically, h2 specified by Expression (5) allows an error of ±2% relative to h2 specified by Expression (6). Within such an error, h2 can be regarded as such a height that the laser beam 301 obtains phases opposite to each other through reflection at the first and second reflection portions 56A and 56B adjacent to each other through the second stepped portion 56D2. The height h2 specified by Expression (6) is such a lowest height that the laser beam 301 obtains phases opposite to each other through reflection at the first and second reflection portions 56A and 56B adjacent to each other.

In the present embodiment, the laser beam 301 incident on the EUV light condensation mirror 50 is diffracted like the laser beam 301 incident on the EUV light condensation mirror 50 in the first example of the comparative example. The EUV light 101 incident on the EUV light condensation mirror 50 is reflected like the EUV light 101 incident on the EUV light condensation mirror 50 in the second example of the comparative example.

5.2 Effect

Figure 9:
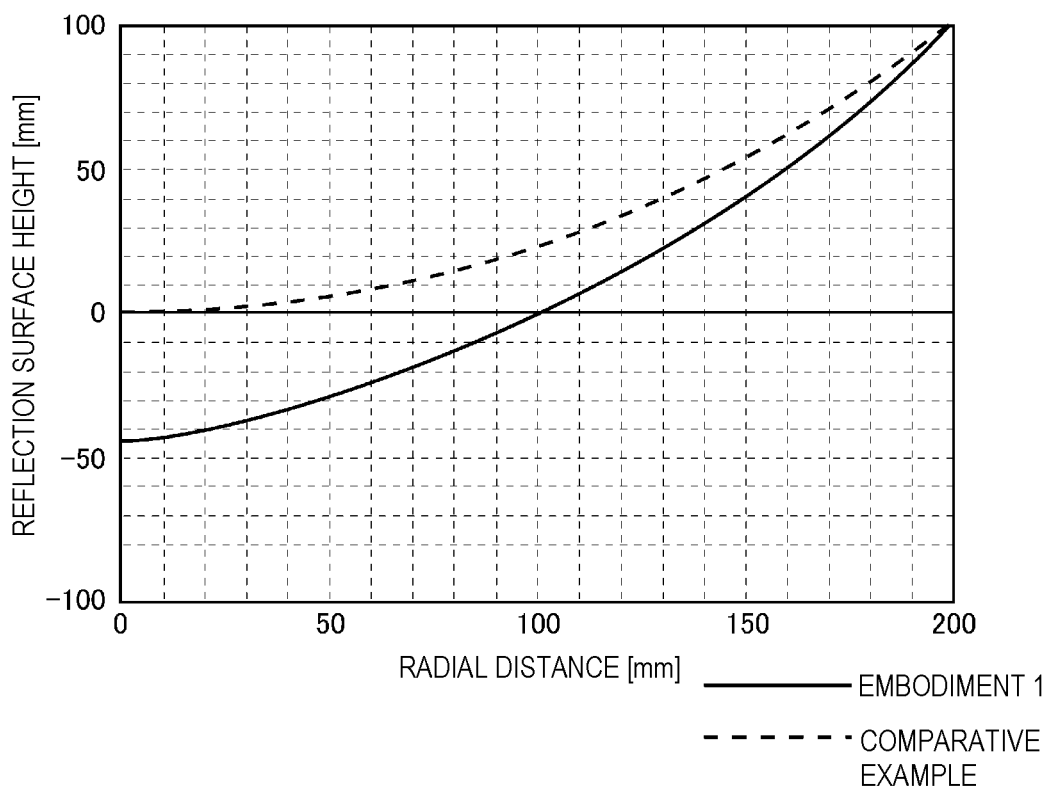
FIG. 9 is a diagram illustrating the relation between the distance in a radial direction from the center of the reflective surface toward the outer periphery thereof and the height of the reflective surface in Embodiment 1.
Figure 10:
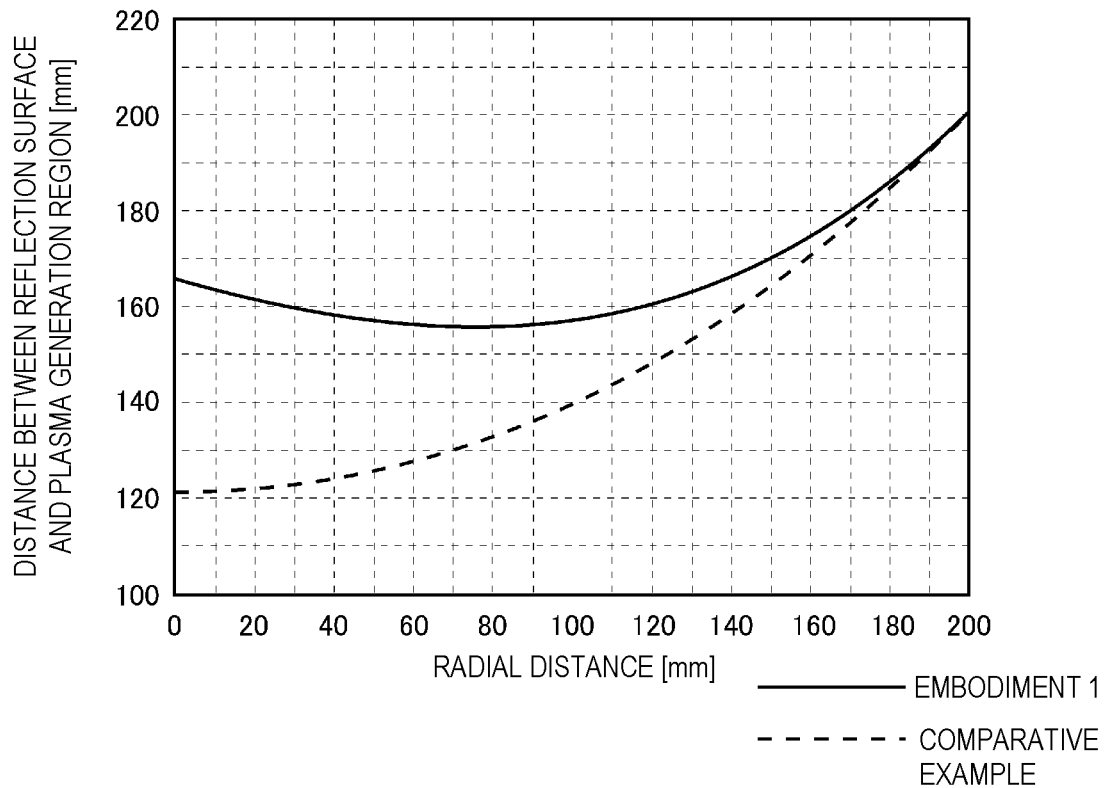
FIG. 10 is a diagram illustrating the relation between the distance in the radial direction from the center of the reflective surface toward the outer periphery thereof and the distance between the reflective surface and a plasma generation region in Embodiment 1.

FIG. 9 is a diagram illustrating the relation between distance in a radial direction from the center 55C of the reflective surface 55 to the outer periphery thereof and the height of the reflective surface 55 in the present embodiment. Thus, FIG. 9 substantially illustrates the shape of the reflective surface 55 of the present embodiment. To produce FIG. 9, "n=20" was set in Expression (4). In FIG. 9, by using the height of the reflective surface 55 at the center 55C in the comparative example as a reference height, the shape of the reflective surface 55 in the comparative example is illustrated with a dashed line, and the height of the reflective surface 55 in the present embodiment is illustrated with a solid line. FIG. 10 is a diagram illustrating the relation between the distance in the radial direction from the center 55C of the reflective surface 55 to the outer periphery thereof in the present embodiment and the distance between the reflective surface 55 and the plasma generation region AR. In FIG. 10 as well, "n=20" was set in Expression (4). In FIG. 10, the distance between the reflective surface 55 and the plasma generation region AR in the comparative example is illustrated with a dashed line, and the distance between the reflective surface 55 and the plasma generation region AR in the present embodiment is illustrated with a solid line.

As illustrated in FIGS. 9 and 10, in the reflective surface 55 of the present embodiment, which satisfies Expressions (4) and (6), the center 55C side of the reflective surface 55 is separated from the plasma generation region AR as compared to the reflective surface 55 of the comparative example, which satisfies Expression (1). This can be explained by the following reason. In the EUV light condensation mirror 50 in the first example of the comparative example, the height of the stepped portion 56D is same between the center side and the outer periphery side of each first reflection portion 56A when the incident angle of the laser beam 301 incident from the plasma generation region AR is not considered. Thus, the stepped portion 56D hardly affects the outline of the reflective surface 55 having a spheroid shape. However, in the present embodiment, the height of the second stepped portion 56D2 contacting each first reflection portion 56A on the outer periphery side of the reflective surface 55 is specified by Expression (5) or (6), whereas the height of the first stepped portion 56D1 contacting the first reflection portion 56A on the center 55C side of the reflective surface 55 is specified by Expression (3) or (4). Thus, as the position moves from the outer periphery side to the center 55C side on the reflective surface 55 of the present embodiment, the height increases at the second stepped portion 56D2 in the reflection direction by the lowest height that the laser beam 301 obtains phases opposite to each other through reflection at the first and second reflection portions 56A and 56B adjacent to each other. However, the height decreases at the first stepped portion 56D1 by a height as the sum of the lowest height that the laser beam 301 obtains phases opposite to each other through reflection at the first and second reflection portions 56A and 56B adjacent to each other and a value obtained by dividing a distance equal to a positive integral multiple of the half wavelength of the laser beam 301 by the cosine of the incident angle of the laser beam 301. Accordingly, as the position moves from the outer periphery side to the center 55C side on the reflective surface 55, the reflective surface 55 of the present embodiment becomes lower than the reflective surface 55 of the comparative example by the height as the sum of the lowest height and the value obtained by dividing the distance equal to a positive integral multiple of the half wavelength of the laser beam 301 by the cosine of the incident angle of the laser beam 301, at each period of the first and second reflection portions 56A and 56B.

Thus, in the reflective surface 55 of the present embodiment, the center 55C of the reflective surface 55 is separated from the plasma generation region AR as compared to the reflective surface 55 of the comparative example, which is illustrated with a dashed line in FIG. 7. Accordingly, with the EUV light condensation mirror 50 of the present embodiment, the irradiation intensity of the EUV light 101 incident on the center 55C side of the reflective surface 55 and the density of ions attributable to plasma are reduced.

The distance between the plasma generation region AR and the reflective surface 55 closest to the plasma generation region AR as the first focal point is substantially 60% of the distance between the plasma generation region AR and the reflective surface 55 farthest from the plasma generation region AR. However, the distance between the plasma generation region AR and the reflective surface 55 closest to the plasma generation region AR is preferably equal to or longer than 72% of the distance between the plasma generation region AR and the reflective surface 55 farthest from the plasma generation region AR. In this case, when the integer n is constant and the pitch of the grooves 55G is 1 mm, the integer n is equal to or larger than 20 based on Expressions (4) and (6). When a different pitch of the grooves 55G is employed, the integer n is substantially proportional to the ratio of the pitch relative to 1 mm and increases as the pitch increases. The following embodiments are described with the example in which the pitch of the grooves 55G is 1 mm.

In the present embodiment, the height of the second stepped portion 56D2 is such a lowest height that the laser beam 301 obtains phases opposite to each other through reflection at the first and second reflection portions 56A and 56B adjacent to each other. Thus, the center 55C side of the reflective surface 55 can be separated from the plasma generation region AR as compared to a case in which the height of the second stepped portion 56D2 is higher than the lowest height that the laser beam 301 obtains phases opposite to each other through reflection at the first and second reflection portions 56A and 56B adjacent to each other. When the height of the first stepped portion 56D1 is higher than the height of the second stepped portion 56D2, the height of the second stepped portion 56D2 may not be such a lowest height that the laser beam 301 obtains phases opposite to each other through reflection at the first and second reflection portions 56A and 56B adjacent to each other. However, in this case as well, the first and second stepped portions 56D1 and 56D2 have such heights that the laser beam 301 obtains phases opposite to each other through reflection at the first and second reflection portions 56A and 56B adjacent to each other. When the height of the first stepped portion 56D1 is higher than the height of the second stepped portion 56D2 in a partial region, the height of the first stepped portion 56D1 may be equivalent to the height of the second stepped portion 56D2 in another partial region.

In the present embodiment, the first and second reflection portions 56A and 56B are concentrically provided with respect to the center 55C. Thus, it is possible to easily fabricate, by machining, a substrate on which the multi-layer reflective film is disposed and that becomes the first reflection portion 56A or the second reflection portion 56B. The first and second reflection portions 56A and 56B do not necessarily need to be concentrically provided with respect to the center 55C. For example, the first reflection portions 56A may be connected with each other in a helical shape. In this case, each second reflection portion 56B has a helical shape as well.

In the present embodiment, the first and second reflection portions 56A and 56B are parts of an elliptical surface conjugate to the plasma generation region AR and the intermediate focus point IF. Thus, the EUV light 101 incident on the reflective surface 55 from the plasma generation region AR and reflected by the first and second reflection portions 56A and 56B can be condensed to a small spot diameter at the intermediate focus point IF.

In a region extending from the center 55C to a position where the radius is equal to a predetermined size, the integer n may increase as the radius increases. In this case, when the region is referred to as a first region, the height of each first stepped portion 56D1 in the first region is lower than the height of each first stepped portion 56D1 in a predetermined second region positioned on the outer periphery side of the reflective surface 55 relative to the first region of the reflective surface 55.

6. Description of EUV Light Condensation Mirror of Embodiment 2

The following describes the configuration of an EUV light condensation mirror of Embodiment 2. Any component same as that described above is denoted by an identical reference sign, and duplicate description thereof is omitted unless specific description is needed.

6.1 Configuration

Figure 11:
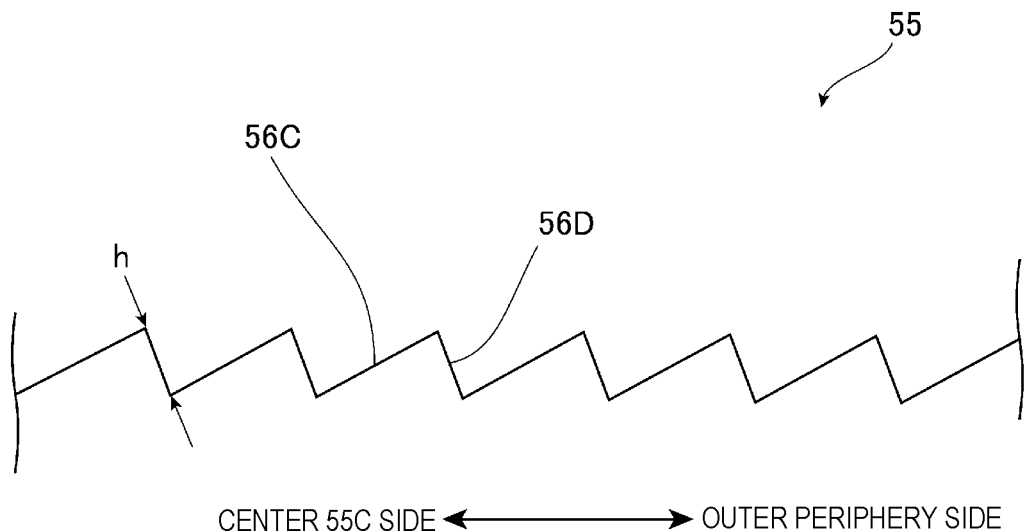
FIG. 11 is an enlarged view illustrating part of the reflective surface in FIG. 7 in Embodiment 2.

The reflective surface 55 of the EUV light condensation mirror 50 of the present embodiment includes a blazed diffraction grating. A front view of the EUV light condensation mirror 50 of the present embodiment from the reflective surface 55 side is same as that in FIG. 3. In addition, a cross-sectional view taken along line IV-IV of FIG. 3 in the present embodiment is same as that in FIG. 7. FIG. 11 is an enlarged view illustrating part of the reflective surface in FIG. 7 in the present embodiment. In the present embodiment, similarly to the second example in the comparative example, the reflective surface 55 includes the reflection portions 56C having concentrically circular shapes centered at the center 55C, and the stepped portion 56D between the reflection portions 56C adjacent to each other. Thus, among the reflection portions 56C adjacent to each other, the reflection portion 56C on the center 55C side is lower in the direction opposite to the reflection direction. In the present embodiment as well, the reflective surface 55 includes the reflection portions 56C and the stepped portions 56D, in a front view of the reflective surface 55, the reflection portions 56C having concentrically circular shapes and surrounding the center 55C, the stepped portions 56D each being positioned between the reflection portions 56C. The shape of each reflection portion 56C is same as the shape of each reflection portion 56C in the comparative example. Although not particularly illustrated, the reflective surface 55 includes the multi-layer reflective film for reflecting the EUV light 101. The multi-layer reflective film is provided to at least each reflection portion 56C. The reflection portions 56C are shaped as parts of a substantially spheroid shape having focal points at the plasma generation region AR and the intermediate focus point IF. In other words, each reflection portion 56C is part of an elliptical surface conjugate to the plasma generation region AR and the intermediate focus point IF, and this relation holds for a configuration in which the reflective surface 55 includes a blazed diffraction grating in the following embodiments as well.

The EUV light condensation mirror 50 of the present embodiment is different from the EUV light condensation mirror 50 in the second example of the comparative example in that the height h of the stepped portion 56D satisfies Expression (7) below.

$$0.98 \times (\lambda/2 + n\lambda/2)/\cos\theta \leq h \leq 1.02 \times (\lambda/2 + n\lambda/2)/\cos\theta \quad (7)$$

In the present embodiment, $\lambda$ and $\theta$ have meanings same as those of $\lambda$ and $\theta$ in Embodiment 1, and n is an integer equal to or larger than one.

The height h more preferably satisfies Expression (8) below.

$$h = (\lambda/2 + n\lambda/2)/\cos\theta \quad (8)$$

Specifically, h specified by Expression (7) allows an error of ±2% relative to h specified by Expression (8). Within such an error, h can be regarded as such a height that the laser beam 301 obtains phases opposite to each other through reflection at the reflection portions 56 adjacent to each other through the stepped portion 56D. The height h is higher than such a lowest height that the laser beam 301 obtains phases opposite to each other through reflection at the reflection portions 56C adjacent to each other.

In the present embodiment, the laser beam 301 incident on the EUV light condensation mirror 50 is diffracted like the laser beam 301 incident on the EUV light condensation mirror 50 in the second example of the comparative example. The EUV light 101 incident on the EUV light condensation mirror 50 is reflected like the EUV light 101 incident on the EUV light condensation mirror 50 in the second example of the comparative example.

6.2 Effect

In the reflective surface 55 of the present embodiment, which satisfies Expressions (7) and (8), the center 55C side of the reflective surface 55 is separated from the plasma generation region AR as compared to the reflective surface 55 of the comparative example, which satisfies Expression (2). This can be explained by the following reason. In the EUV light condensation mirror 50 in the second example of the comparative example, the height of the stepped portion 56D is constant when the incident angle of the laser beam 301 incident from the plasma generation region AR is not considered. Thus, the stepped portion 56D hardly affects the outline of the reflective surface 55 having a spheroid shape. However, in the present embodiment, the height h of the stepped portion 56D, which is specified by Expression (7) or (8) is larger than that of the stepped portion 56D of the second example of the comparative example, which is specified by Expression (2). Specifically, as the position moves from the outer periphery side to the center 55C side on the reflective surface 55 of the present embodiment, the height decreases at the stepped portion 56D by the height as the sum of the lowest height that the laser beam 301 obtains phases opposite to each other through reflection at the reflection portions 56C adjacent to each other and the value obtained by dividing the distance equal to a positive integral multiple of the half wavelength of the laser beam 301 by the cosine of the incident angle of the laser beam 301. Accordingly, as the position moves from the outer periphery side to the center 55C side on the reflective surface 55, the reflective surface 55 of the present embodiment becomes lower than the reflective surface 55 of the comparative example by the height as the sum of the lowest height and the value obtained by dividing the distance equal to a positive integral multiple of the half wavelength of the laser beam 301 by the cosine of the incident angle of the laser beam 301, at each period of the reflection portions 56C.

Thus, in the reflective surface 55 of the present embodiment, similarly to Embodiment 1, the center 55C side of the reflective surface 55 is separated from the plasma generation region AR as compared to the reflective surface 55 of the comparative example, which is illustrated with a dashed line in FIG. 7. Accordingly, with the EUV light condensation mirror 50 of the present embodiment, the irradiation intensity of the EUV light 101 incident on the center 55C side of the reflective surface 55 and the density of ions attributable to plasma may be reduced.

The distance between the plasma generation region AR and the reflective surface 55 closest to the plasma generation region AR as the first focal point is preferably equal to or longer than 72% of the distance between the plasma generation region AR and the reflective surface 55 farthest from the plasma generation region AR. In this case, when the integer n is constant and the pitch of the grooves 55G is 1 mm, the integer n is equal to or larger than 20 based on Expressions (4) and (6).

In the present embodiment, the reflection portions 56C are concentrically provided with respect to the center 55C. Thus, it is possible to easily fabricate, by machining, a substrate on which the multi-layer reflective film is disposed and that becomes the reflection portion 56C. The reflection portions 56C do not necessarily need to be concentrically provided with respect to the center 55C. For example, the reflection portions 56C may be connected with each other in a helical shape.

In the present embodiment, the reflection portions 56C are parts of an elliptical surface conjugate to the plasma generation region AR and the intermediate focus point IF. Thus, the EUV light 101 incident on the reflective surface 55 from the plasma generation region AR and reflected by the reflection portions 56C can be condensed to a small spot diameter at the intermediate focus point IF.

In a region extending to a position where the distance in the radial direction from the center 55C to the outer periphery, in other words, the radius is equal to a predetermined size, the integer n may increase as the radius increases. In this case, when the region is referred to as a first region, the height of each stepped portion 56D in the first region is lower than the height of each stepped portion 56D in a predetermined second region positioned on the outer periphery side of the reflective surface 55 relative to the first region of the reflective surface 55.

7. Description of EUV Light Condensation Mirror of Embodiment 3

The following describes the configuration of an EUV light condensation mirror of Embodiment 3. Any component same as that described above is denoted by an identical reference sign, and duplicate description thereof is omitted unless specific description is needed.

7.1 Configuration

Figure 12:
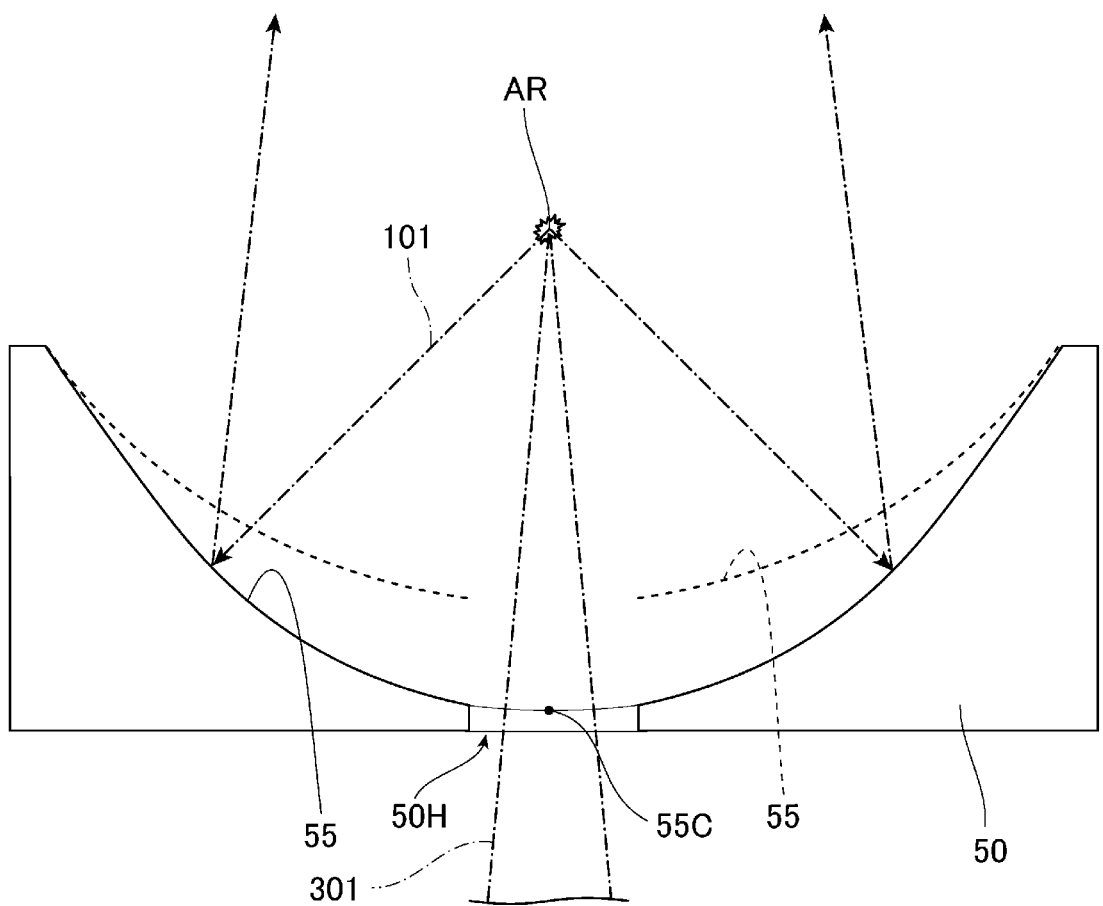
FIG. 12 is a cross-sectional view taken along line IV-IV of FIG. 3 in Embodiment 3.

The reflective surface 55 of the EUV light condensation mirror 50 of the present embodiment includes a binary diffraction grating. A front view of the EUV light condensation mirror 50 of the present embodiment from the reflective surface 55 side is same as that in FIG. 3. FIG. 12 is a cross-sectional view taken along line IV-IV of FIG. 3 in the present embodiment. Similarly to Embodiment 1, the reflective surface 55 of the EUV light condensation mirror 50 of the present embodiment includes the first and second reflection portions 56A and 56B, the first stepped portions 56D1, and the second stepped portions 56D2. The EUV light condensation mirror 50 of the present embodiment is different from the EUV light condensation mirror 50 of Embodiment 1 in that at least two of the first reflection portions 56A intersect an identical spherical surface centered at the plasma generation region AR. In other words, in the EUV light condensation mirror 50 of the present embodiment, at least two of the first reflection portions 56A are positioned substantially on the identical spherical surface centered at the plasma generation region AR.

Figure 13:
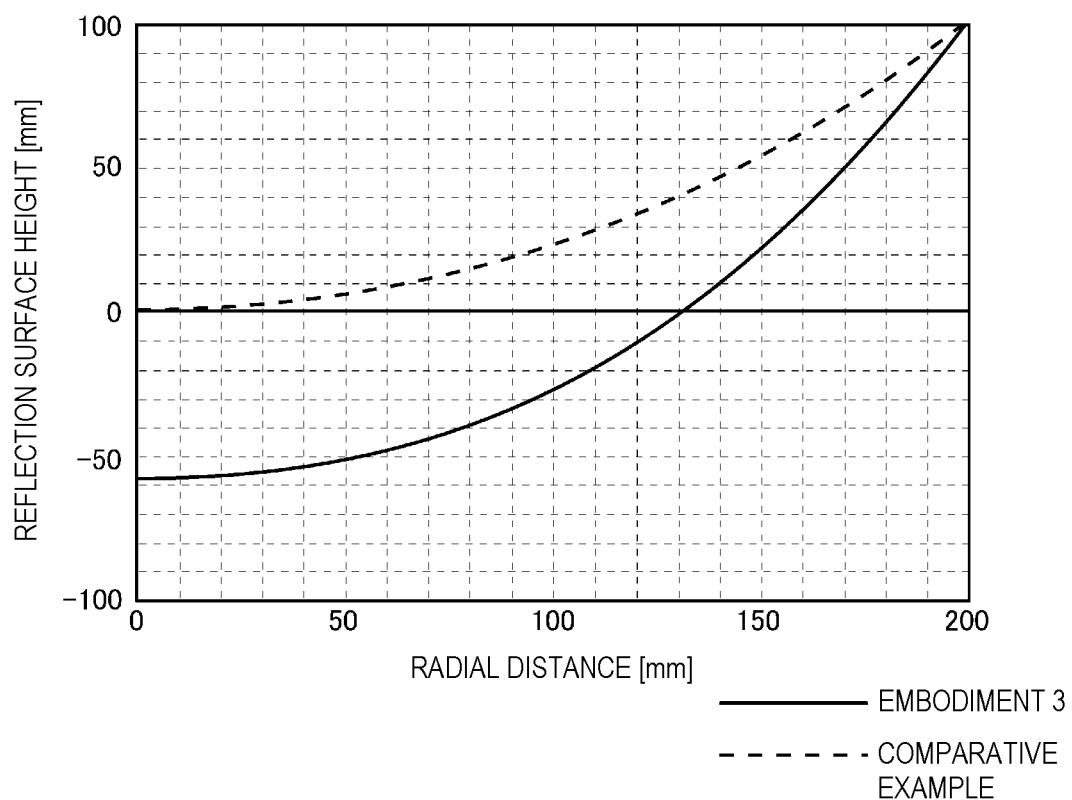
FIG. 13 is a diagram illustrating the relation between the distance in the radial direction from the center of the reflective surface toward the outer periphery thereof and the height of the reflective surface in Embodiment 3.
Figure 14:
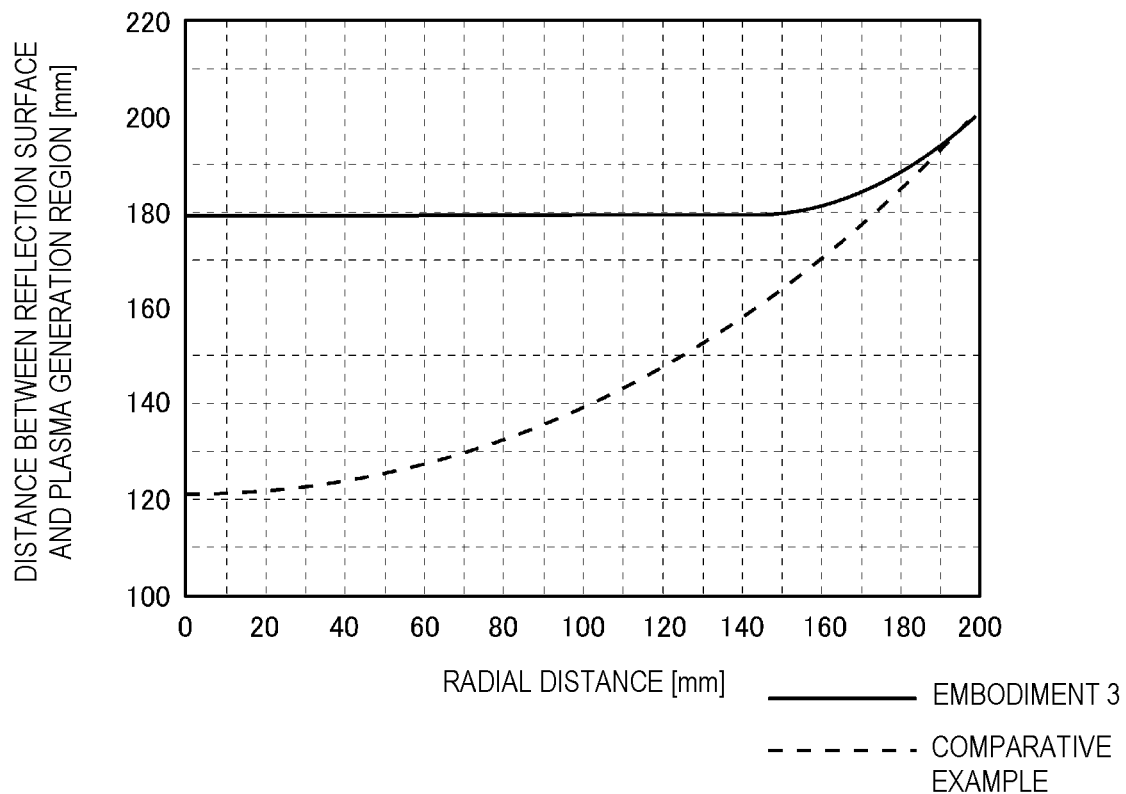
FIG. 14 is a diagram illustrating the relation between the distance in the radial direction from the center of the reflective surface toward the outer periphery thereof and the distance between the reflective surface and the plasma generation region in Embodiment 3.

FIG. 13 is a diagram illustrating the relation between the distance in the radial direction from the center 55C of the reflective surface 55 to the outer periphery thereof in the present embodiment and the height of the reflective surface 55. Thus, FIG. 13 is a diagram illustrating the relation with the reflective surface of the present embodiment. In FIG. 14, the distance between the reflective surface 55 and the plasma generation region AR in the comparative example is illustrated with a dashed line, and the distance between the reflective surface 55 and the plasma generation region AR in the present embodiment is illustrated with a solid line. As understood from FIG. 14, in the present embodiment, the distance between the reflective surface 55 and the plasma generation region AR is constant in a region extending from the center 55C to the position substantially at 140 mm on the reflective surface 55 having a radius of 200 mm. Thus, in the present embodiment, the reflective surface 55 is positioned substantially on an identical spherical surface centered at the plasma generation region AR in the region extending from the center 55C to the position substantially at 140 mm on the reflective surface 55 having a radius of 200 mm. Thus, each first reflection portion 56A in the region intersects an identical spherical surface centered at the plasma generation region AR. In addition, each second reflection portion 56B in the region intersects an identical spherical surface centered at the plasma generation region AR. However, the spherical surface that the first reflection portion 56A intersects and the spherical surface that the second reflection portion 56B intersects have diameters different from each other. On the outer periphery side of the reflective surface 55 relative to the region, the distance from the plasma generation region AR to the reflective surface 55 increases as the position moves closer to the outer periphery side.

Figure 15:
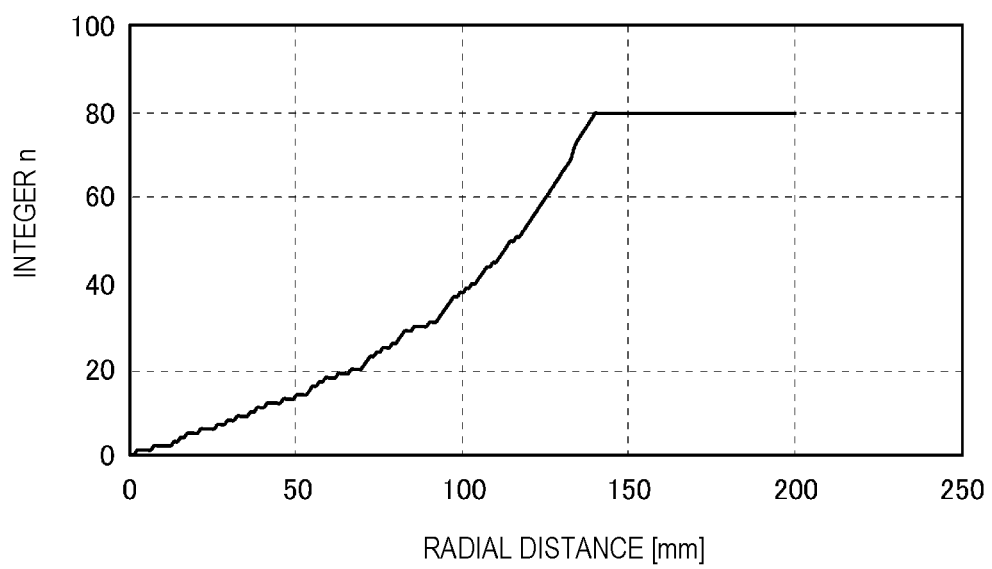
FIG. 15 is a diagram illustrating the relation between the distance in the radial direction from the center of the reflective surface toward the outer periphery thereof and a positive integer n in Embodiment 3.

In the present embodiment as well, each first stepped portion 56D1 preferably satisfies Expressions (3) and (4). However, the positive integer n changes in at least part of the region. FIG. 15 is a diagram illustrating the relation between the distance in the radial direction from the center 55C of the reflective surface 55 to the outer periphery thereof and the positive integer n. As illustrated in FIG. 15, in the region in which the radius is substantially up to 140 mm, when the first reflection portions 56A are positioned at an equal distance from the plasma generation region AR, the integer n increases as the position moves from the center 55C of the reflective surface 55 to the outer periphery thereof and the change rate thereof increases as the position moves closer to the outer periphery side. The integer n is 80 where the radius is substantially equal to 140 mm.

Specifically, the integer n in the region is specified by Expression (9) below when the radius is represented by r mm.

$$N = 3.3 \times 10^{-5} r^3 - 3.2 \times 10^{-3} r^2 + 0.38 - 1.41 \quad (9)$$

In the example illustrated in FIG. 15, the integer n is constant on the outer periphery side of the region.

Figure 16:
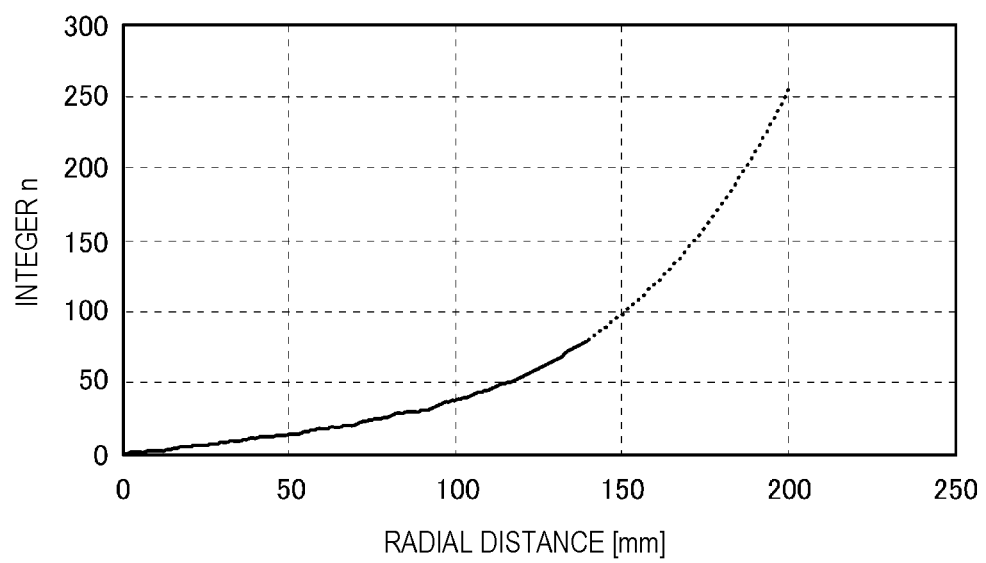
FIG. 16 is a diagram illustrating the relation between the distance in the radial direction from the center of the reflective surface toward the outer periphery thereof and the positive integer n when first reflection portions are positioned on an identical spherical surface centered at the plasma generation region in the entire region of the reflective surface in Embodiment 4.

FIG. 16 is a diagram illustrating the relation between the distance in the radial direction from the center 55C of the reflective surface 55 to the outer periphery thereof and the positive integer n when the first reflection portions 56A are positioned on an identical spherical surface centered at the plasma generation region AR in the entire region of the reflective surface 55. In this case, since the integer n increases as the position moves from the center 55C to the outer periphery, and the change rate of the integer n increases as the position moves closer to the outer periphery side, the integer n is substantially 250 at the outermost periphery. However, in this case, some first stepped portions 56D1 are potentially too high. As illustrated with a solid line in FIG. 16, the integer n is preferably equal to or smaller than 80. Thus, the first reflection portions 56A are preferably positioned substantially on an identical spherical surface centered at the plasma generation region AR as described above in the region extending from the center 55C to the position where the radius is equal to 140 mm, and the integer n is preferably constant at 80 in Expression (3) or (4) in a region on the outer periphery side of the above-described region. In this case, when a predetermined region in the region extending from the center 55C to the position where the radius is equal to 140 mm is referred to as a first region, the height of each first stepped portion 56D1 in the first region is lower than the height of each first stepped portion 56D1 in a predetermined second region positioned on the outer periphery side of the reflective surface 55 relative to the first region of the reflective surface 55.

7.2 Effect

In the present embodiment, at least two of the first reflection portions 56A intersect an identical spherical surface centered at the plasma generation region AR as the first focal point. Thus, when the intensity of EUV light radiated from the plasma generation region AR is same in any direction, the degree of degradation is substantially same between the at least two first reflection portions 56A intersecting the spherical surface.

In the present embodiment, the reflective surface 55 includes a binary diffraction grating but may include a blazed diffraction grating. Specifically, in the reflective surface 55 including the reflection portions 56C and the stepped portions 56D similarly to Embodiment 2, at least two of the reflection portions 56C may intersect an identical spherical surface centered at the plasma generation region AR. In this case, the positive integer n in Expressions (5) and (6) increases as the position moves from the center 55C of the reflective surface 55 to the outer periphery thereof, and the change rate thereof increases as the position moves closer to the outer periphery side. It is not preferable as described above that the integer n is too large, and the integer n is preferably equal to or smaller than 80 in the example of a blazed diffraction grating as well. Thus, in this example, the first reflection portions 56A are preferably positioned on an identical spherical surface centered at the plasma generation region AR in the region extending from the center 55C to the position where the radius is equal to 140 mm, and the integer n is preferably constant at 80 or smaller in Expression (5) or (6) in a region on the outer periphery side of the above-described region. In this case as well, when a predetermined region in the region extending from the center to a position where the radius is equal to 140 mm is referred to as a first region, the height of each stepped portion 56D in the first region is lower than the height of each stepped portion 56D in a predetermined second region positioned on the outer periphery side of the reflective surface 55 relative to the first region of the reflective surface 55.

8. Description of EUV Light Condensation Mirror of Embodiment 4

The following describes the configuration of an EUV light condensation mirror of Embodiment 5. Any component same as that described above is denoted by an identical reference sign, and duplicate description thereof is omitted unless specific description is needed.

8.1 Configuration

Figure 17:
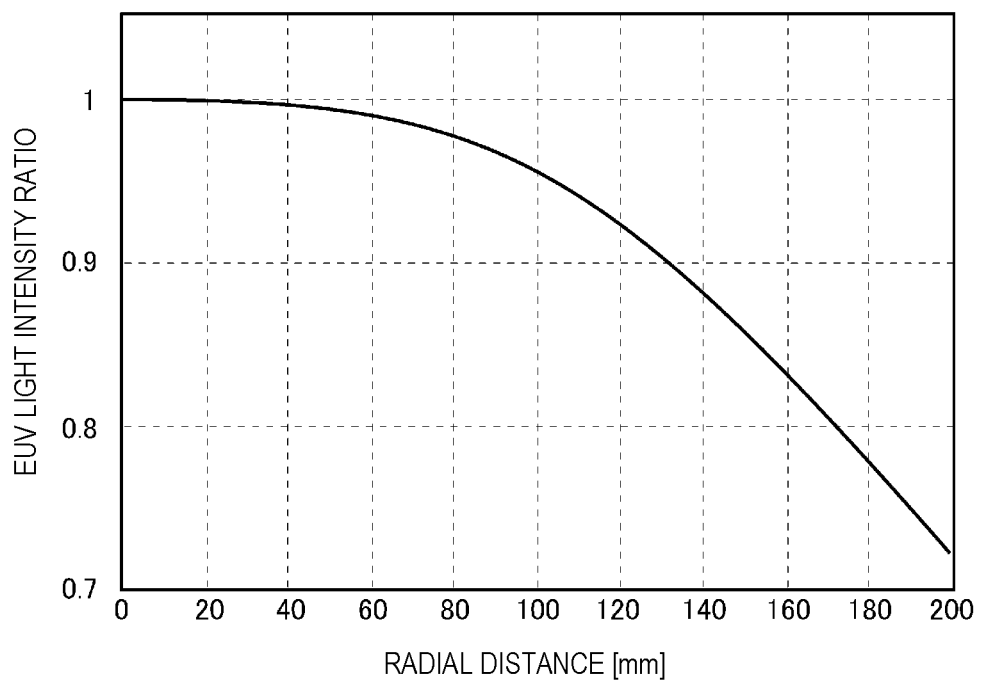
FIG. 17 is a diagram illustrating an exemplary relation between the distance in the radial direction from the center of the reflective surface toward the outer periphery thereof and the intensity ratio of EUV light incident on the reflective surface in Embodiment 4.

FIG. 17 is a diagram illustrating an exemplary relation between the distance in the radial direction from the center 55C of the reflective surface 55 to the outer periphery thereof and the intensity ratio of the EUV light 101 traveling toward the reflective surface in the EUV light condensation mirror 50 of the present embodiment. In other words, FIG. 17 illustrates distribution of the intensity ratio of the EUV light incident on the reflective surface 55. In the example illustrated in FIG. 17, the intensity of the EUV light 101 incident on the EUV light condensation mirror 50 tends to increase as the position moves closer to the center 55C side of the reflective surface 55. In FIG. 17, the intensity of the EUV light incident on the center 55C of the reflective surface 55 is set to be one. In a case of the EUV light generation apparatus 100 illustrated in FIG. 2, the intensity distribution of the EUV light 101 incident on the EUV light condensation mirror 50 tends to be substantially same as the intensity distribution illustrated in FIG. 17.

Figure 18:
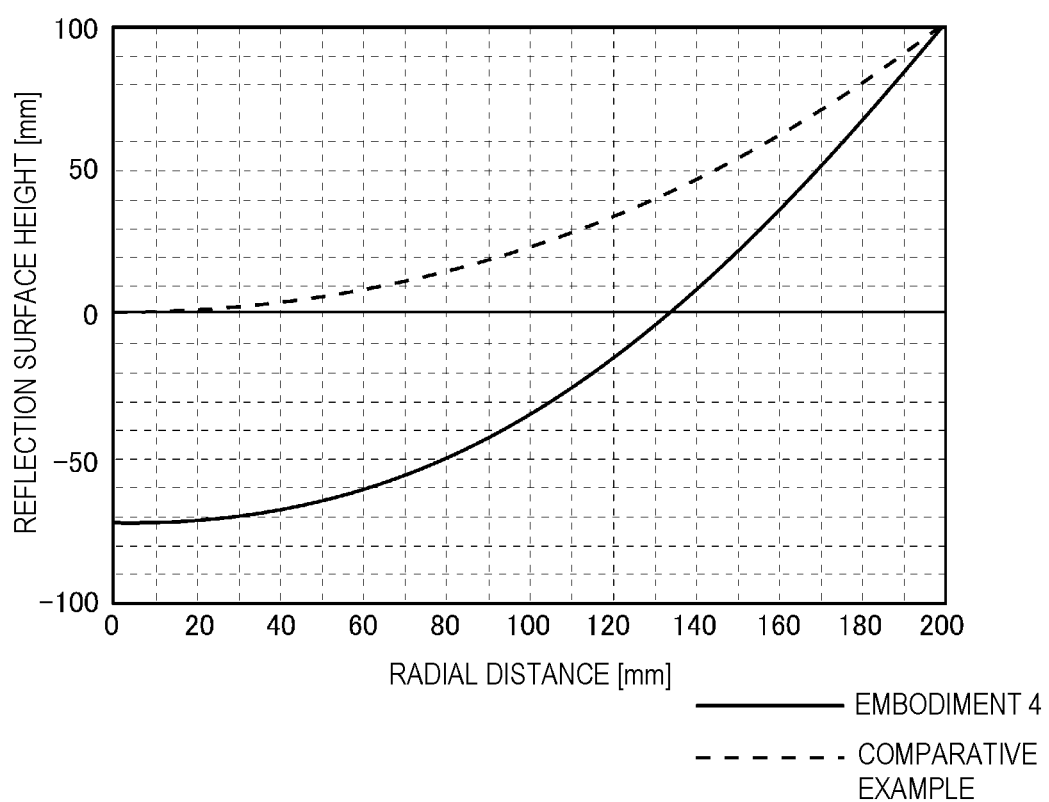
FIG. 18 is a diagram illustrating the relation between the distance in the radial direction from the center of the reflective surface toward the outer periphery thereof and the height of the reflective surface in Embodiment 4.

FIG. 18 is a diagram illustrating the relation between the distance in the radial direction from the center 55C of the reflective surface 55 to the outer periphery thereof in the present embodiment and the height of the reflective surface 55. Thus, FIG. 18 substantially illustrates the shape of the reflective surface 55 of the present embodiment. In FIG. 18, by using the height of the reflective surface 55 at the center 55C in the comparative example as a reference height, the shape of the reflective surface 55 in the comparative example is illustrated with a dashed line, and the reflective surface 55 in the present embodiment is illustrated with a solid line. In the present embodiment, the reflective surface 55 includes a binary diffraction grating as in Embodiment 1.

Figure 19:
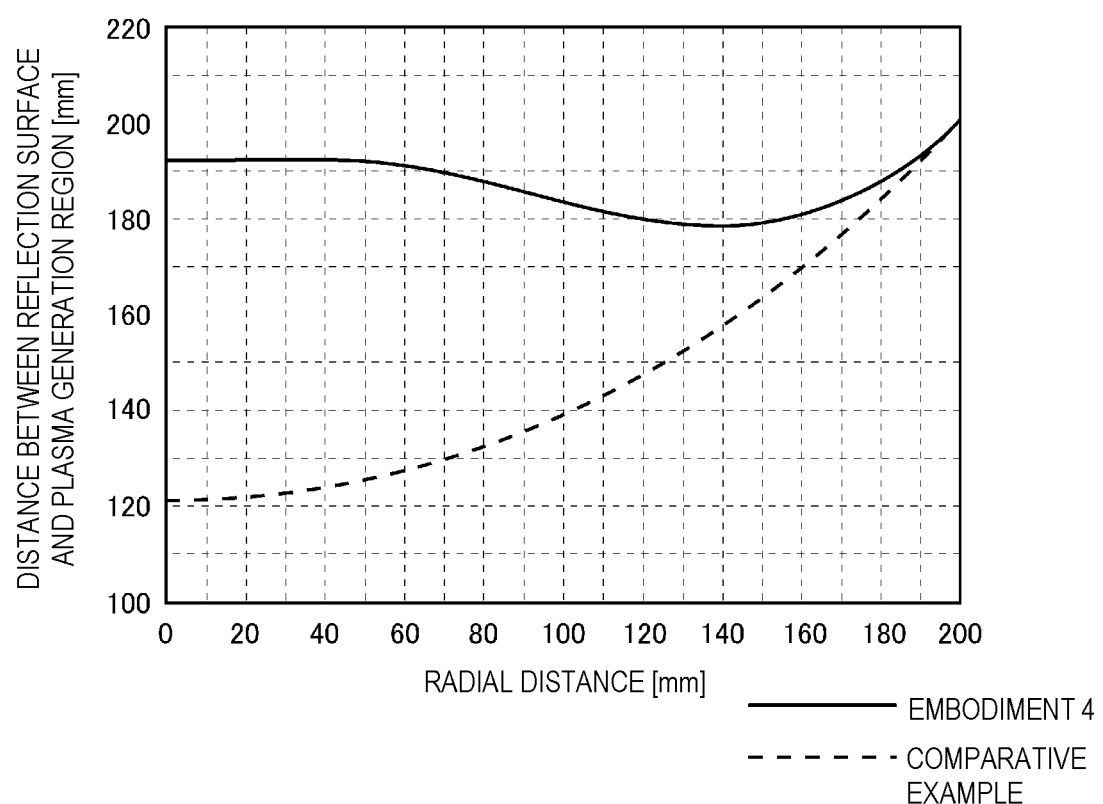
FIG. 19 is a diagram illustrating the relation between the distance in the radial direction from the center of the reflective surface toward the outer periphery thereof and distance between the reflective surface and the plasma generation region in Embodiment 4.

FIG. 19 is a diagram illustrating the relation between the distance in the radial direction from the center 55C of the reflective surface 55 to the outer periphery thereof in the present embodiment and the distance between the reflective surface 55 and the plasma generation region AR. In FIG. 19, the distance between the reflective surface 55 and the plasma generation region AR in the comparative example is illustrated with a dashed line, and the distance between the reflective surface 55 and the plasma generation region AR in the present embodiment is illustrated with a solid line. As understood from FIG. 19, in the present embodiment, the distance between the reflective surface 55 and the plasma generation region AR is longer at a site where the intensity of the EUV light 101 is higher in the region extending from the center 55C to the position substantially at 140 mm on the reflective surface 55 having a radius of 200 mm. On the outer periphery side of the region, the distance from the plasma generation region AR to the reflective surface 55 increases as the position moves closer to the outer periphery side.

Figure 20:
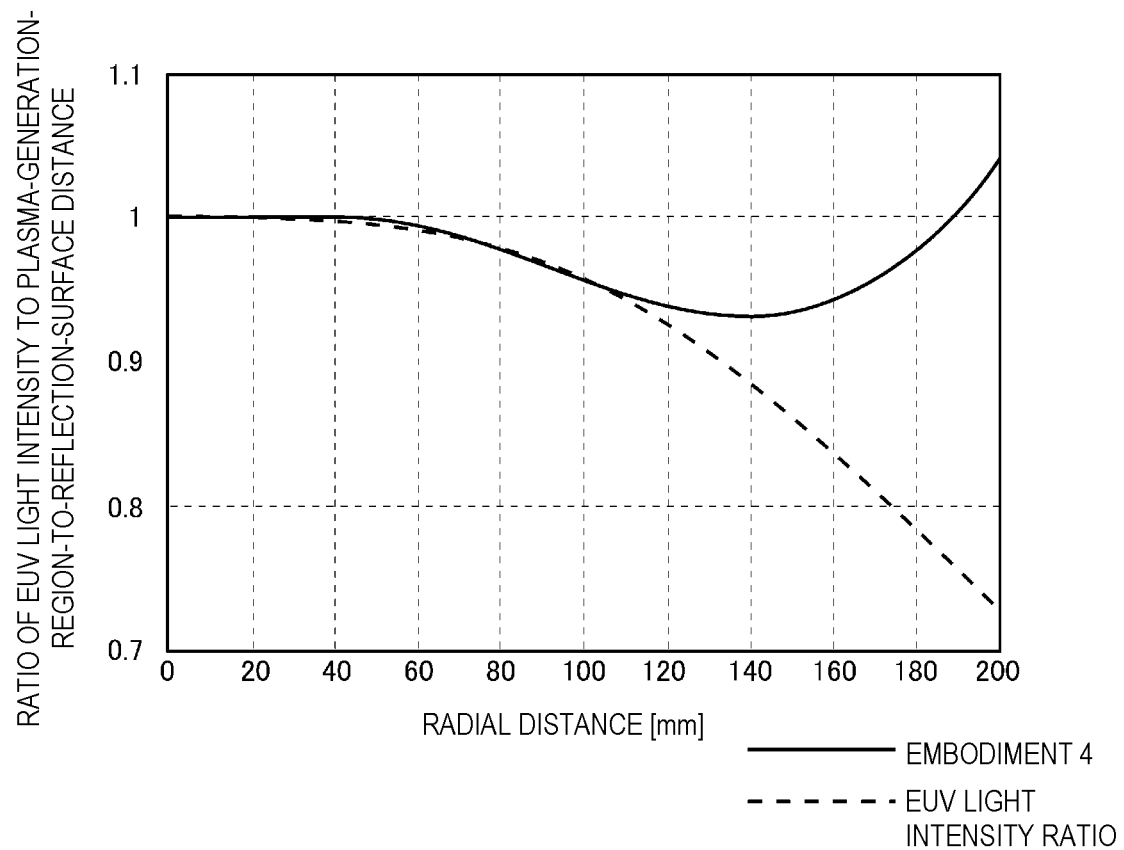
FIG. 20 is a diagram illustrating the relation between the distance in the radial direction from the center of the reflective surface toward the outer periphery thereof and a ratio of the EUV light intensity to the plasma-generation-region-to-reflective-surface distance in Embodiment 4.

FIG. 20 is a diagram illustrating the relation between the distance in the radial direction from the center 55C of the reflective surface 55 to the outer periphery thereof in the present embodiment and a ratio of the EUV light intensity to the plasma-generation-region-to-reflective-surface distance. The ratio of the EUV light intensity to the plasma-generation-region-to-reflective-surface distance indicates a ratio of the intensity of the EUV light 101, which is illustrated in FIG. 17, and the normalized distance between the reflective surface 55 and the plasma generation region AR, which is illustrated in FIG. 19. The normalization of the distance between the reflective surface 55 and the plasma generation region AR, which is illustrated in FIG. 19 is performed with reference to the distance between the reflective surface 55 and the plasma generation region AR at the center 55C. Thus, in FIG. 20, the value at the center 55C of the reflective surface 55 is one. In FIG. 20, the intensity distribution of EUV light incident on the reflective surface 55, which is illustrated in FIG. 17 is illustrated with a dashed line. As illustrated in FIG. 20, in the present embodiment, in a region extending from the center 55C to the position substantially at 100 mm, the distribution of the ratio substantially matches the intensity distribution of EUV light incident on the reflective surface 55. On the outer periphery side of the region, the ratio is further larger than the intensity distribution of EUV light incident on the reflective surface 55 as the position moves closer to the outer periphery side.

Figure 21:
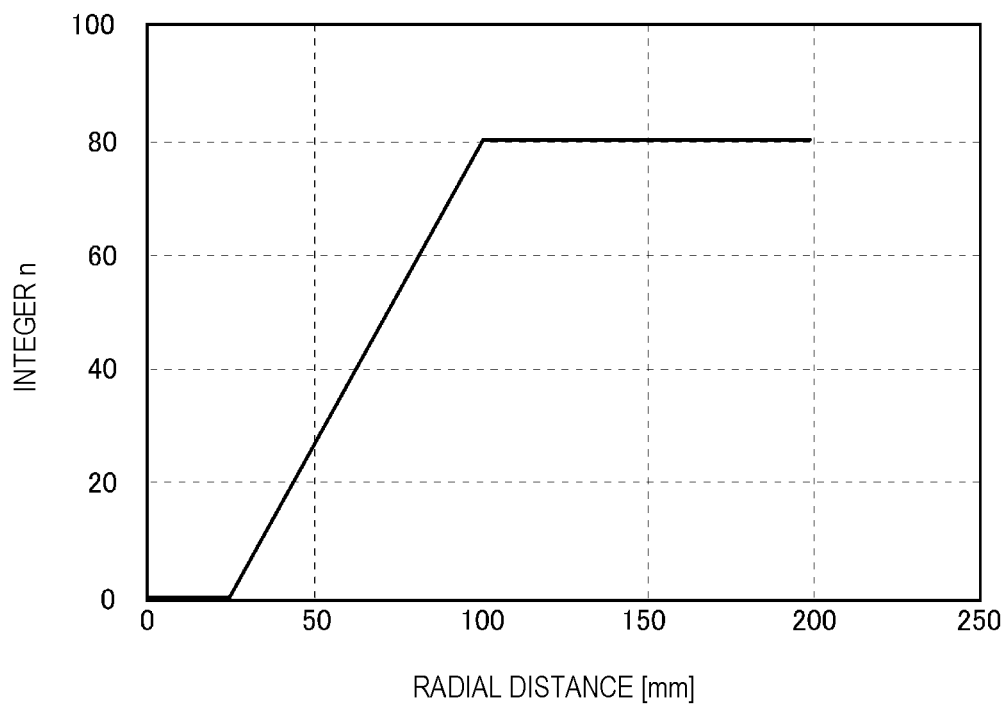
FIG. 21 is a diagram illustrating the relation between the distance in the radial direction from the center of the reflective surface toward the outer periphery thereof and the positive integer n in Embodiment 4.

As described above, since the reflective surface 55 of the present embodiment includes a binary diffraction grating, each first stepped portion 56D1 preferably satisfies Expressions (3) and (4) in the present embodiment as well. However, the positive integer n changes in at least part of the region extending from the center 55C to the position substantially at 100 mm. FIG. 21 is a diagram illustrating the relation between the distance in the radial direction from the center 55C of the reflective surface 55 to the outer periphery thereof in the present embodiment and the positive integer n. The integer n linearly increases in a region extending from the center 55C to the position of 25 mm to 100 mm. The integer n is constant on the outer periphery side of this region. Thus, when a predetermined region in the region extending from the center 55C to the position of 25 mm to 100 mm is referred to as a first region, the height of each first stepped portion 56D1 in the first region is lower than the height of each first stepped portion 56D1 in a predetermined second region positioned on the outer periphery side of the reflective surface 55 relative to the first region of the reflective surface 55.

8.2 Effect

In the present embodiment, at least in a partial region of the reflective surface 55, the distance between the reflective surface 55 and the plasma generation region AR is longer in a region in which the intensity of EUV light incident on the reflective surface 55 is higher. Thus, at least in the partial region, variation in degradation of the reflective surface 55 can be reduced.

In the present embodiment, the reflective surface 55 includes a binary diffraction grating. However, in the reflective surface 55 including a blazed diffraction grating, the distance between the reflective surface 55 and the plasma generation region AR is preferably longer in a region in which the intensity of EUV light incident on the reflective surface 55 is higher at least in a partial region of the reflective surface 55. Thus, the integer n in Expressions (7) and (8) preferably increases in the region extending from the center 55C to the position of 25 mm to 100 mm. Thus, in the case of a blazed diffraction grating as well, when a predetermined region in the region extending from the center 55C to the position of 25 mm to 100 mm is referred to as a first region, the height of each stepped portion 56D in the first region is preferably lower than the height of each stepped portion 56D in a predetermined second region positioned on the outer periphery side of the reflective surface 55 relative to the first region of the reflective surface 55. In addition, in the reflective surface 55 including a blazed diffraction grating, as well, "n=0" may be set in Expressions (7) and (8) in the region extending from the center to the position of 25 mm.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of the any thereof and any other than A, B, and C.

What is claimed is:

1. An extreme ultraviolet light condensation mirror comprising a reflective surface formed in a concave shape and configured to reflect extreme ultraviolet light incident from a first focal point so that the extreme ultraviolet light condenses to a second focal point at a position different from that of the first focal point and diffract a laser beam incident from the first focal point and having a wavelength longer than a wavelength of the extreme ultraviolet light, the reflective surface being provided with a plurality of first reflection portions, a plurality of second reflection portions, a plurality of first stepped portions, and a plurality of second stepped portions: in a front view of the reflective surface, the first reflection portions surrounding a center of the reflective surface; the second reflection portions surrounding the center and being positioned between the first reflection portions and lower than the adjacent first reflection portions in a direction opposite to a reflection direction; the first stepped portions each being positioned between the corresponding first reflection portion and the second reflection portion adjacent to the first reflection portion on a side of the center; the second stepped portions each being positioned between the corresponding first reflection portion and the second reflection portion adjacent to the first reflection portion on an outer periphery side of the reflective surface, the first and second stepped portions having such heights that the laser beam obtains phases opposite to each other through reflection at the first and second reflection portions adjacent to each other, a height of the first stepped portion being higher than a height of the second stepped portion adjacent to the first stepped portion via the first reflection portion, when the wavelength of the laser beam is λ, the angle of incidence of the laser beam on the reflecting surface is θ, and an integer greater than or equal to 1 is n, the height h1 of the first stepped portion and the height h2 of the second stepped portion satisfy the following expressions:

$h1=(\lambda/4+n\lambda/2)/\cos\theta$, and $0.98\times(\lambda/4)/\cos\theta \leq h2 \leq 1.02\times(\lambda/4)/\cos\theta.$ 2. The extreme ultraviolet light condensation mirror according to claim 1, wherein the height of each second reflection portion is such a lowest height that the laser beam obtains phases opposite to each other through reflection at the first and second reflection portions adjacent to each other.

3. The extreme ultraviolet light condensation mirror according to claim 1, wherein at least two of the first reflection portions intersect an identical spherical surface centered at the first focal point.

4. The extreme ultraviolet light condensation mirror according to claim 1, wherein the first and second reflection portions are concentrically provided with respect to the center.

5. The extreme ultraviolet light condensation mirror according to claim 1, wherein the first and second reflection portions are parts of an elliptical surface conjugate to the first focal point and the second focal point.

6. The extreme ultraviolet light condensation mirror according to claim 1, wherein a partial region of the reflective surface has a reflection structure in which no first and second stepped portions are formed and with which the extreme ultraviolet light incident from the first focal point is condensed to the second focal point.

7. The extreme ultraviolet condensation mirror according to claim 1, wherein the height of the first stepped portion in a first region of the reflective surface is a height at which the integer is increased as a radius increases from the center of the reflective surface, and is lower than the height of the first stepped portion in the second region located on the outer peripheral side of the reflection surface with respect to the first region.

8. The extreme ultraviolet light condensation mirror according to claim 7, wherein the height of each second reflection portion is such a lowest height that the laser beam obtains phases opposite to each other through reflection at the first and second reflection portions adjacent to each other.

9. The extreme ultraviolet light condensation mirror according to claim 7, wherein at least two of the first reflection portions intersect an identical spherical surface centered at the first focal point.

10. The extreme ultraviolet light condensation mirror according to claim 7, wherein the first and second reflection portions are concentrically provided with respect to the center.

11. The extreme ultraviolet light condensation mirror according to claim 7, wherein the first and second reflection portions are parts of an elliptical surface conjugate to the first focal point and the second focal point.

12. The extreme ultraviolet light condensation mirror according to claim 7, wherein a partial region of the reflective surface has a reflection structure in which no first and second stepped portions are formed and with which the extreme ultraviolet light incident from the first focal point is condensed to the second focal point.

13. An extreme ultraviolet light condensation mirror comprising a reflective surface formed in a concave shape and configured to reflect extreme ultraviolet light incident from a first focal point so that the extreme ultraviolet light condenses to a second focal point at a position different from that of the first focal point and diffract a laser beam incident from the first focal point and having a wavelength longer than a wavelength of the extreme ultraviolet light,
the reflective surface being provided with a plurality of reflection portions and a plurality of stepped portions: in a front view of the reflective surface, the reflection portions surrounding a center of the reflective surface; the stepped portions each being positioned between the reflection portions adjacent to each other so that one reflection portion of the adjacent reflective portions on a side of the center is lower than the other reflection portion on an outer periphery side of the reflective surface in a direction opposite to a reflection direction,
the stepped portions having such heights that the laser beam obtains phases opposite to each other through reflection at the reflection portions adjacent to each other,
a height of the stepped portions being higher than such a lowest height that the laser beam obtains phases opposite to each other through reflection at the reflection portions adjacent to each other,
when the wavelength of the laser beam is $\lambda$, the angle of incidence of the laser beam on the reflecting surface is $\theta$, and an integer greater than or equal to 1 is n, the height h of the stepped portion satisfies the following expressions:

$h=(\lambda/2+n\lambda/2)/\cos\theta$, and $0.98\times(\lambda/2+n\lambda/2)/\cos\theta \leq h \leq 1.02\times(\lambda/2+n\lambda/2)/\cos\theta$.

14. The extreme ultraviolet light condensation mirror according to claim 13, wherein at least two of the reflection portions intersect an identical spherical surface centered at the first focal point.

15. The extreme ultraviolet light condensation mirror according to claim 13, wherein the reflection portions are concentrically provided with respect to the center.

16. The extreme ultraviolet light condensation mirror according to claim 13, wherein the reflection portions are parts of an elliptical surface conjugate to the first focal point and the second focal point.

17. The extreme ultraviolet light condensation mirror according to claim 13, wherein a partial region of the reflective surface has a reflection structure in which no stepped portions are formed and with which the extreme ultraviolet light incident from the first focal point is condensed to the second focal point.

18. The extreme ultraviolet condensation mirror according to claim 13, wherein the height of the stepped portion in a first region of the reflective surface is a height at which the integer is increased as a radius increases from the center of the reflective surface, and is lower than the height of the stepped portion in the second region located on the outer peripheral side of the reflection surface with respect to the first region.

19. The extreme ultraviolet light condensation mirror according to claim 18, wherein at least two of the reflection portions intersect an identical spherical surface centered at the first focal point.

20. The extreme ultraviolet light condensation mirror according to claim 18, wherein the reflection portions are concentrically provided with respect to the center.

21. The extreme ultraviolet light condensation mirror according to claim 18, wherein the reflection portions are parts of an elliptical surface conjugate to the first focal point and the second focal point.

22. The extreme ultraviolet light condensation mirror according to claim 18, wherein a partial region of the reflective surface has a reflection structure in which no stepped portions are formed and with which the extreme ultraviolet light incident from the first focal point is condensed to the second focal point.

23. An extreme ultraviolet light generation apparatus comprising:
a chamber having an internal space in which a laser beam is condensed and plasma is generated from a target substance at a condensed position of the laser beam; and
an extreme ultraviolet light condensation mirror configured to condense extreme ultraviolet light radiated through the plasma generation from the target substance,
the extreme ultraviolet light condensation mirror including a reflective surface formed in a concave shape and configured to reflect extreme ultraviolet light incident from a first focal point as the condensed position so that the extreme ultraviolet light condenses to a second focal point at a position different from that of the first focal point and diffract the laser beam incident from the first focal point and having a wavelength longer than a wavelength of the extreme ultraviolet light,
the reflective surface being provided with a plurality of first reflection portions, a plurality of second reflection portions, a plurality of first stepped portions, and a plurality of second stepped portions: in a front view of the reflective surface, the first reflection portions surrounding a center of the reflective surface; the second reflection portions surrounding the center and being positioned between the first reflection portions and lower than the adjacent first reflection portions in a direction opposite to a reflection direction; the first stepped portions each being positioned between the corresponding first reflection portion and the second reflection portion adjacent to the first reflection portion on a side of the center; the second stepped portions each being positioned between the corresponding first reflection portion and the second reflection portion adjacent to the first reflection portion on an outer periphery side of the reflective surface, the first and second stepped portions having such heights that the laser beam obtains phases opposite to each other through reflection at the first and second reflection portions adjacent to each other, a height of the first stepped portion being higher than a height of the second stepped portion adjacent to the first stepped portion via the first reflection portion, when the wavelength of the laser beam is λ, the angle of incidence of the laser beam on the reflecting surface is θ, and an integer greater than or equal to 1 is n, the height h1 of the first stepped portion and the height h2 of the second stepped portion satisfy the following expressions:

$h1=(\lambda/4+n\lambda/2)/\cos \theta$, and $0.98\times(\lambda/4)/\cos \theta \leq h2 \leq 1.02\times(\lambda/4)/\cos \theta$.

24. An extreme ultraviolet light generation apparatus comprising:

a chamber having an internal space in which a laser beam is condensed and plasma is generated from a target substance at a condensed position of the laser beam; and an extreme ultraviolet light condensation mirror configured to condense extreme ultraviolet light radiated through the plasma generation from the target substance, the extreme ultraviolet light condensation mirror including a reflective surface formed in a concave shape and configured to reflect extreme ultraviolet light incident from a first focal point as the condensed position so that the extreme ultraviolet light condenses to a second focal point at a position different from that of the first focal point and diffract the laser beam incident from the first focal point and having a wavelength longer than a wavelength of the extreme ultraviolet light, the reflective surface being provided with a plurality of reflection portions and a plurality of stepped portions: in a front view of the reflective surface, the reflection portions surrounding a center of the reflective surface; the stepped portions each being positioned between the reflection portions adjacent to each other so that one reflection portion of the adjacent reflective portions on a side of the center is lower than the other reflection portion on an outer periphery side of the reflective surface in a direction opposite to a reflection direction, the stepped portions having such heights that the laser beam obtains phases opposite to each other through reflection at the reflection portions adjacent to each other, a height of the stepped portions being higher than such a lowest height that the laser beam obtains phases opposite to each other through reflection at the reflection portions adjacent to each other, when the wavelength of the laser beam is λ, the angle of incidence of the laser beam on the reflecting surface is θ, and an integer greater than or equal to 1 is n, the height h of the stepped portion satisfies the following expressions:

$h=(\lambda/2+n\lambda/2)/\cos \theta$, and $0.98\times(\lambda/2+n\lambda/2)/\cos \theta \leq h \leq 1.02\times(\lambda/2+n\lambda/2)/\cos \theta$.

25. An electronic device manufacturing method comprising:

generating extreme ultraviolet light with an extreme ultraviolet light generation apparatus;

outputting the extreme ultraviolet light to an exposure apparatus; and exposing a photosensitive substrate to the extreme ultraviolet light in the exposure apparatus to manufacture an electronic device, the extreme ultraviolet light generation apparatus including a chamber having an internal space in which a laser beam is condensed and plasma is generated from a target substance at a condensed position of the laser beam, and an extreme ultraviolet light condensation mirror configured to condense extreme ultraviolet light radiated through the plasma generation from the target substance, the extreme ultraviolet light condensation mirror including a reflective surface formed in a concave shape and configured to reflect extreme ultraviolet light incident from a first focal point as the condensed position so that the extreme ultraviolet light condenses to a second focal point at a position different from that of the first focal point and diffract the laser beam incident from the first focal point and having a wavelength longer than a wavelength of the extreme ultraviolet light, the reflective surface being provided with a plurality of first reflection portions, a plurality of second reflection portions, a plurality of first stepped portions, and a plurality of second stepped portions: in a front view of the reflective surface, the first reflection portions surrounding a center of the reflective surface; the second reflection portions surrounding the center and being positioned between the first reflection portions and lower than the adjacent first reflection portions in a direction opposite to a reflection direction; the first stepped portions each being positioned between the corresponding first reflection portion and the second reflection portion adjacent to the first reflection portion on a side of the center; the second stepped portions each being positioned between the corresponding first reflection portion and the second reflection portion adjacent to the first reflection portion on an outer periphery side of the reflective surface, the first and second stepped portions having such heights that the laser beam obtains phases opposite to each other through reflection at the first and second reflection portions adjacent to each other, a height of the first stepped portion being higher than a height of the second stepped portion adjacent to the first stepped portion via the first reflection portion, when the wavelength of the laser beam is λ, the angle of incidence of the laser beam on the reflecting surface is θ, and an integer greater than or equal to 1 is n, the height h1 of the first stepped portion and the height h2 of the second stepped portion satisfy the following expressions:

$h1=(\lambda/4+n\lambda/2)/\cos \theta$, and $0.98\times(\lambda/4)/\cos \theta \leq h2 \leq 1.02\times(\lambda/4)/\cos \theta$.

26. An electronic device manufacturing method comprising:

generating extreme ultraviolet light with an extreme ultraviolet light generation apparatus;

outputting the extreme ultraviolet light to an exposure apparatus; and exposing a photosensitive substrate to the extreme ultraviolet light in the exposure apparatus to manufacture an electronic device, the extreme ultraviolet light generation apparatus including a chamber having an internal space in which a laser beam is condensed and plasma is generated from a target substance at a condensed position of the laser beam, and an extreme ultraviolet light condensation mirror configured to condense extreme ultraviolet light radiated through the plasma generation from the target substance, the extreme ultraviolet light condensation mirror including a reflective surface formed in a concave shape and configured to reflect extreme ultraviolet light incident from a first focal point as the condensed position so that the extreme ultraviolet light condenses to a second focal point at a position different from that of the first focal point and diffract the laser beam incident from the first focal point and having a wavelength longer than a wavelength of the extreme ultraviolet light, the reflective surface being provided with a plurality of reflection portions and a plurality of stepped portions:

in a front view of the reflective surface, the reflection portions surrounding a center of the reflective surface;

the stepped portions each being positioned between the reflection portions adjacent to each other so that one reflection portion of the adjacent reflective portions on a side of the center is lower than the other reflection portion on an outer periphery side of the reflective surface in a direction opposite to a reflection direction, the stepped portions having such heights that the laser beam obtains phases opposite to each other through reflection at the reflection portions adjacent to each other, a height of the stepped portions being higher than such a lowest height that the laser beam obtains phases opposite to each other through reflection at the reflection portions adjacent to each other, when the wavelength of the laser beam is $\lambda$, the angle of incidence of the laser beam on the reflecting surface is $\theta$, and an integer greater than or equal to 1 is n, the height h of the stepped portion satisfies the following expressions:

$h = (\lambda/2 + n\lambda/2)/\cos\theta$, and $0.98 \times (\lambda/2 + n\lambda/2)/\cos\theta \leq h \leq 1.02 \times (\lambda/2 + n\lambda/2)/\cos\theta$.

* * * * *